（12）United States Patent
Kogura et al.

(10) Patent No.: US 10,036,092 B2
(45) Date of Patent: Jul. 31, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Shintaro Kogura, Toyama (JP); Ryota Sasajima, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/859,855

(22) Filed: Sep. 21, 2015

(65) Prior Publication Data

US 2016/0097126 A1    Apr. 7, 2016

(30) Foreign Application Priority Data

Oct. 2, 2014  (JP) ................................ 2014-203831

(51) Int. Cl.
*C23C 16/52*     (2006.01)
*C23C 16/44*     (2006.01)
(Continued)

(52) U.S. Cl.
CPC .............. *C23C 16/52* (2013.01); *C23C 16/30* (2013.01); *C23C 16/4408* (2013.01);
(Continued)

(58) Field of Classification Search
None
See application file for complete search history.

(56) References Cited

U.S. PATENT DOCUMENTS

2008/0107824 A1* 5/2008 Hasebe ............. C23C 16/45525
427/576
2011/0076857 A1* 3/2011 Akae ....................... C23C 16/32
438/769

(Continued)

FOREIGN PATENT DOCUMENTS

JP    2006-245256 A    9/2006

OTHER PUBLICATIONS

Office Action in CN counterpart Application No. 201510543534.3 dated Aug. 31, 2017.

*Primary Examiner* — Joseph A Miller, Jr.
(74) *Attorney, Agent, or Firm* — Volpe and Koenig, P.C.

(57) ABSTRACT

A Technique includes forming a film on a substrate in a process chamber by performing a cycle a predetermined number of times. The cycle includes non-simultaneously performing supplying a precursor gas to the substrate, exhausting the precursor gas from the process chamber, supplying an oxygen-containing gas to the substrate, exhausting the oxygen-containing gas from the process chamber, supplying a hydrogen-containing gas to the substrate, and exhausting the hydrogen-containing gas from the process chamber. At least one among an amount of an exhausted gas and an exhaust rate in the act of exhausting the oxygen-containing gas is set greater than that in the act of exhausting the precursor gas, and at least one among an amount of an exhausted gas and an exhaust rate in the act of exhausting the hydrogen-containing gas is set greater than that in the act of exhausting the precursor gas.

18 Claims, 13 Drawing Sheets

(51) Int. Cl.
  *H01L 21/02* (2006.01)
  *C23C 16/30* (2006.01)
  *C23C 16/455* (2006.01)
  *C23C 16/458* (2006.01)

(52) U.S. Cl.
  CPC .... *C23C 16/4584* (2013.01); *C23C 16/45531* (2013.01); *C23C 16/45546* (2013.01); *C23C 16/45578* (2013.01); *H01L 21/0214* (2013.01); *H01L 21/0228* (2013.01); *H01L 21/02126* (2013.01); *H01L 21/02164* (2013.01); *H01L 21/02208* (2013.01); *H01L 21/02211* (2013.01)

(56) References Cited

U.S. PATENT DOCUMENTS

2011/0197813 A1  8/2011  Ishida et al.
2013/0017685 A1  1/2013  Akae et al.

\* cited by examiner

FIG. 9
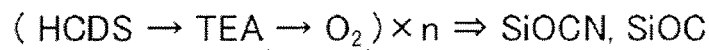
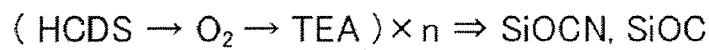
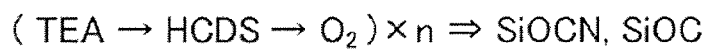
FIG. 10
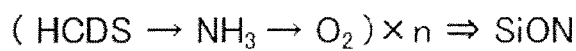
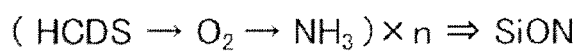

FIG. 11

$$(\text{HCDS} \rightarrow \underset{\underset{A}{\uparrow}}{H_2} \rightarrow \underset{\underset{B}{\uparrow}}{O_2}) \times n \Rightarrow \text{SiO}$$

$$(\text{HCDS} \rightarrow \underset{\underset{A}{\uparrow}}{O_2} \rightarrow \underset{\underset{B}{\uparrow}}{H_2}) \times n \Rightarrow \text{SiO}$$

$$(\underset{\underset{B}{\uparrow}}{H_2} \rightarrow \text{HCDS} \rightarrow \underset{\underset{A}{\uparrow}}{O_2}) \times n \Rightarrow \text{SiO}$$

FIG. 12

$$(\text{TiCl}_4 \rightarrow \underset{\underset{A}{\uparrow}}{NH_3} \rightarrow \underset{\underset{B}{\uparrow}}{O_3}) \times n \Rightarrow \text{TiON, TiO}$$

$$(\text{TiCl}_4 \rightarrow \underset{\underset{A}{\uparrow}}{O_3} \rightarrow \underset{\underset{B}{\uparrow}}{NH_3}) \times n \Rightarrow \text{TiON, TiO}$$

$$(\underset{\underset{B}{\uparrow}}{NH_3} \rightarrow \text{TiCl}_4 \rightarrow \underset{\underset{A}{\uparrow}}{O_3}) \times n \Rightarrow \text{TiON, TiO}$$

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2014-203831, filed on Oct. 2, 2014, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate is often carried out by non-simultaneously supplying a precursor gas, an oxygen (O)-containing gas and a hydrogen (H)-containing gas to the substrate accommodated in a process chamber.

However, in some cases, a large amount of particles are generated within the process chamber when supplying an O-containing gas or a H-containing gas into the process chamber.

SUMMARY

The present disclosure provides some embodiments of a technique capable of suppressing generation of particles when forming a film on a substrate.

According to one embodiment of the present disclosure, there in provided a technique which includes forming a film on a substrate accommodated in a process chamber by performing a cycle a predetermined number of times, the cycle including non-simultaneously performing supplying a precursor gas to the substrate in the process chamber, exhausting the precursor gas from the process chamber, supplying an oxygen-containing gas to the substrate in the process chamber, exhausting the oxygen-containing gas from the process chamber, supplying a hydrogen-containing gas to the substrate in the process chamber, and exhausting the hydrogen-containing gas from the process chamber, wherein at least one among an amount of an exhausted gas and an exhaust rate in the act of exhausting the oxygen-containing gas is set greater than an amount of an exhausted gas or an exhaust rate in the act of exhausting the precursor gas, and at least one among an amount of an exhausted gas and an exhaust rate in the act of exhausting the hydrogen-containing gas is set greater than the amount of the exhausted gas or the exhaust rate in the act of exhausting the precursor gas.

BRIEF DESCRIPTION OF THE DRAWINGS

FIG. 9 is a view illustrating modifications 8 to 10 of the film forming sequence according to one embodiment of the present disclosure.

FIG. 10 is a view illustrating modifications 11 to 13 of the film forming sequence according to one embodiment of the present disclosure.

FIG. 11 is a view illustrating modifications 14 to 16 of the film forming sequence according to one embodiment of the present disclosure.

FIG. 12 is a view illustrating a film forming sequence according to another embodiment of the present disclosure.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
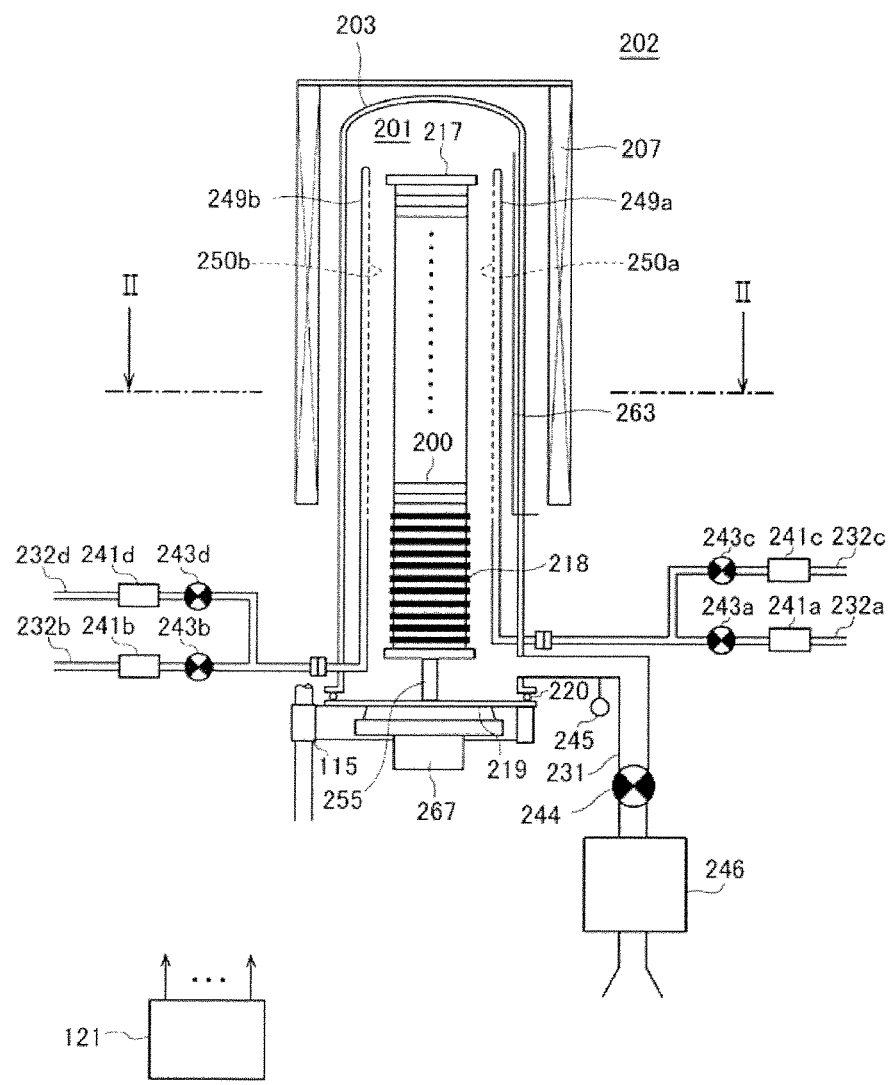
FIG. 1 is a schematic configuration view of a vertical processing furnace of a substrate processing apparatus suitably used in one embodiment of the present disclosure, in which a portion of the processing furnace is shown in a vertical cross section.
Figure 2:
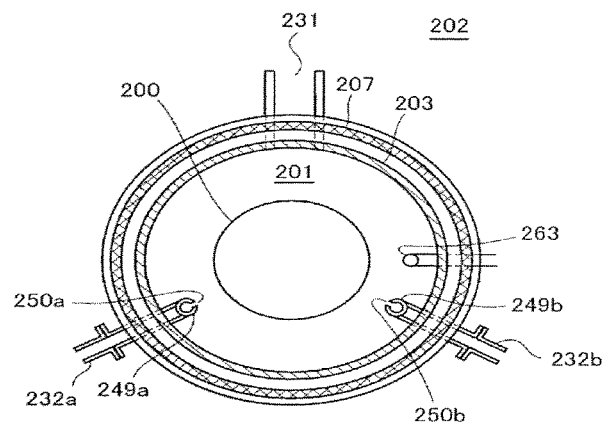
FIG. 2 is a schematic configuration view of the vertical processing furnace of the substrate processing apparatus suitably used in one embodiment of the present disclosure, in which a portion of the processing furnace is shown in a cross section taken along line II-II in FIG. 1.

As shown in FIG. 1, a processing furnace 202 includes a heater 207 as a heating part (a heating mechanism). The heater 207 has a cylindrical shape and is supported by a heater base (not shown) serving as a support plate so as to be vertically installed. As will be described later, the heater 207 functions as an activation mechanism (an excitation part) configured to thermally activate (excite) a gas.

A reaction tube 203 constituting a reaction vessel (process vessel) is disposed inside the heater 207 in a concentric relationship with the heater 207. The reaction tube 203 is made of, e.g., a heat resistant material such as quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate a plurality of wafers 200 as substrates. The wafers 200 are horizontally stacked at multiple stages along a vertical direction in a boat 217 which will be described later.

A nozzle 249a as a first nozzle and a nozzle 249b as a second nozzle are installed in the process chamber 201 to penetrate through a lower portion of a sidewall of the reaction tube 203. The nozzle 249b is made of, e.g., a heat resistant material such as quartz, SiC or the like. Gas supply pipes 232a and 232b are respectively connected to the nozzles 249a and 249b. In this way, the two nozzles 249a and 249b and the two gas supply pipes 232a and 232b are installed in the reaction tube 203 and are capable of supplying plural kinds of gases into the process chamber 201.

However, the processing furnace 202 of the present embodiment is not limited to the configuration as described above. For example, a manifold made of metal and configured to support the reaction tube 203 may be installed under the reaction tube 203. Each of the nozzles may be installed to penetrate through a sidewall of the manifold. In this case, an exhaust pipe 231, which will be described later, may be further installed in the manifold. Alternatively, the exhaust pipe 231 may be installed in a lower portion of the reaction tube 203 rather than in the manifold. A furnace opening portion of the processing furnace 202 may be made of metal and the nozzles or the like may be installed in the metal-made furnace opening portion.

Mass flow controllers (MFC) 241a and 241b, which are flow rate controllers (flow rate control parts), and valves 243a and 243b, which are opening/closing valves, are sequentially installed in the gas supply pipes 232a and 232b from the corresponding upstream sides. Gas supply pipes 232c and 232d, which supply an inert gas, are respectively connected to the gas supply pipes 232a and 232b at the downstream side of the valves 243a and 243b. MFCs 241c and 241d, which are flow rate controllers (flow rate control parts), and valves 243c and 243d, which are opening/closing valves, are sequentially installed in the gas supply pipes 232c and 232d from the corresponding upstream sides.

The nozzles 249a and 249b are respectively connected to end portions of the gas supply pipes 232a and 232b. As shown in FIG. 2, the nozzles 249a and 249b are disposed in an annular space between the inner wall of the reaction tube 203 and the wafers 200 such that the nozzles 249a and 249b extend upward along an arrangement direction of the wafers 200 from a lower portion of the inner wall of the reaction tube 203 to an upper portion thereof. Specifically, the nozzles 249a and 249b are installed along a wafer arrangement region in which the wafers 200 are arranged and in a region that horizontally surrounds the wafer arrangement region at a side of the wafer arrangement region. That is to say, the nozzles 249a and 249b are respectively installed in a perpendicular relationship with the surfaces (flat surfaces) of the wafers 200 at a lateral side of the end portions (peripheral edge portions) of the wafers 200 carried into the process chamber 201. Each of the nozzles 249a and 249b is configured as an L-shaped nozzle. A horizontal portion of each of the nozzles 249a and 249b is installed to penetrate a lower sidewall of the reaction tube 203. A vertical portion of each of the nozzles 249a and 249b is installed to extend upward at least from one end portion of the wafer arrangement region toward the other end portion thereof. A plurality of gas supply holes 250a and 250b for supplying gas is respectively formed on the side surfaces of the nozzles 249a and 249b. Each of the gas supply holes 250a and 250b is opened toward the center of the reaction tube 203 to allow the gas to be supplied toward the wafers 200. The gas supply holes 250a and 250b may be formed in a plural number so as to span from the lower portion of the reaction tube 203 to the upper portion thereof. The respective gas supply holes 250a and 250b may have the same opening area. Further, the gas supply holes 250a and 250b may be formed at a predetermined opening pitch.

As described above, in the present embodiment, a gas is transferred through the nozzles 249a and 249b, which are disposed in the vertically-elongated annular space, i.e., a cylindrical space, defined by the inner surface of the side wall of the reaction tube 203 and the end portions (peripheral edge portions) of the wafers 200 arranged within the reaction tube 203. The gas is initially injected into the reaction tube 203, near the wafers 200, through the gas supply holes 250a and 250b formed in the nozzles 249a and 249b. Accordingly, the gas supplied into the reaction tube 203 mainly flows within the reaction tube 203 in a direction parallel to surfaces of the wafers 200, i.e., in a horizontal direction. With this configuration, the gas can be uniformly supplied to the respective wafers 200. This makes a thickness of a thin film formed on each of the wafers 200 uniform. In addition, the gas flowing on the surfaces of the wafers 200 after reaction, i.e., the reacted residual gas, flows toward an exhaust port, i.e., the exhaust pipe 231 which will be described later. The flow direction of the residual gas is not limited to a vertical direction but may be appropriately decided depending on a position of the exhaust port.

A precursor gas having a predetermined element, for example, a halosilane precursor gas including Si as the predetermined element and a halogen element, is supplied from the gas supply pipe 232a into the process chamber 201 via the MFC 241a, the valve 243a and the nozzle 249a.

The halosilane precursor gas refers to a gaseous halosilane precursor, for example, a gas obtained by vaporizing a halosilane precursor which remains in a liquid state under a room temperature and an atmospheric pressure, or a halosilane precursor which remains in a gas state under a room temperature and an atmospheric pressure. The halosilane precursor refers to a silane precursor having a halogen group. Examples of the halogen group may include a chloro group, a fluoro group, a bromo group and an iodine group. That is to say, the halogen group includes a halogen element such as chlorine (Cl), fluorine (F), bromine (Br), iodine (I) or the like. The halosilane precursor may be said to be one kind of halide. When the term "precursor" is used herein, it may refer to "a liquid precursor staying in a liquid state," "a precursor gas staying in a gaseous state," or both.

Figure 13A:
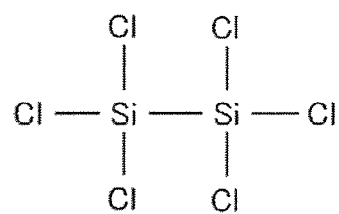
FIG. 13A is a view illustrating a chemical structural formula of HCDS.
Figure 13B:
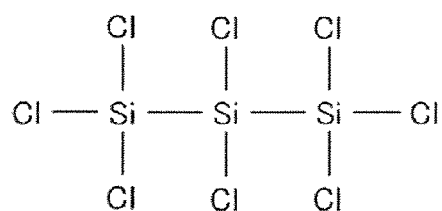
FIG. 13B is a view illustrating a chemical structural formula of OCTS.

As the halosilane precursor gas, it may be possible to use, e.g., a C-free precursor gas containing Si and Cl, namely an inorganic chlorosilane precursor gas. As the inorganic chlorosilane precursor gas, it may be possible to use, e.g., a hexachlorodisilane ($Si_2Cl_6$, abbreviation: HCDS) gas or an octachlorotrisilane ($Si_3Cl_8$, abbreviation: OCTS) gas. FIG. 13A illustrates a chemical structural formula of HCDS, and FIG. 13B illustrates a chemical structural formula of OCTS. These gases may be referred to as precursor gases which contain at least two Si atoms in one molecule and contain Cl and which have a Si—Si bond. These gases act as Si sources in a substrate processing process which will be described later.

Figure 14A:
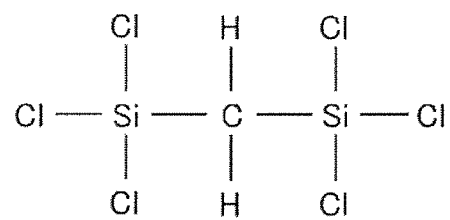
FIG. 14A is a view illustrating a chemical structural formula of BTCSM.
Figure 14B:
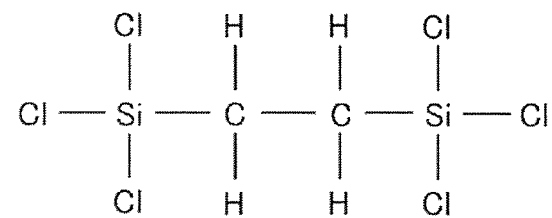
FIG. 14B is a view illustrating a chemical structural formula of BTCSE.

Furthermore, as the halosilane precursor gas, it may be possible to use, e.g., a precursor gas containing Si, Cl and an alkylene group and having a Si—C bond, namely an alkylene chlorosilane precursor gas which is an organic chlorosilane precursor gas. The alkylene group includes a methylene group, an ethylene group, a propylene group, a butylene group, and so forth. The alkylene chlorosilane precursor gas may be referred to as an alkylene halosilane precursor gas. As the alkylene chlorosilane precursor gas, it may be possible to use, e.g., a bis(trichlorosilyl)methane (($SiCl_3)_2CH_2$, abbreviation: BTCSM) gas and an ethylene bis(trichlorosilane) gas, namely a 1,2-bis(trichlorosilyl)ethane (($SiCl_3)_2C_2H_4$, abbreviation: BTCSE) gas. FIG. 14A illustrates a chemical structural formula of BTCSM, and FIG. 14B illustrates a chemical structural formula of BTCSE. These gases may be referred to as precursor gases which contain at least two Si atoms in one molecule and contain C and Cl and which have a Si—C bond. These gases act as Si sources and C sources in a substrate processing process which will be described later.

Figure 15A:
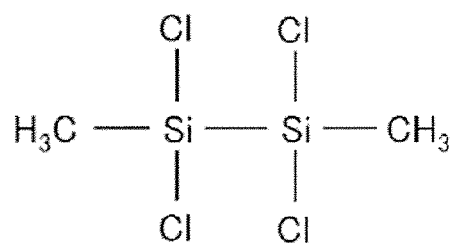
FIG. 15A is a view illustrating a chemical structural formula of TCDMDS.
Figure 15B:
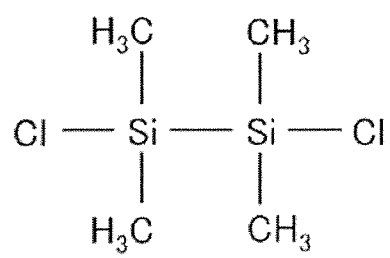
FIG. 15B is a view illustrating a chemical structural formula of DCTMDS.
Figure 15C:
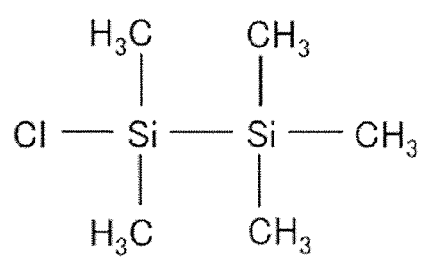
FIG. 15C is a view illustrating a chemical structural formula of MCP-MDS.

Moreover, as the halosilane precursor gas, it may be possible to use, e.g., a precursor gas containing Si, Cl and an alkyl group and having a Si—C bond, namely an alkyl chlorosilane precursor gas which is an organic chlorosilane precursor gas. The alkyl group includes a methyl group, an ethyl group, a propyl group, a butyl group, and so forth. The alkyl chlorosilane precursor gas may be referred to as an alkyl halosilane precursor gas. As the alkyl chlorosilane precursor gas, it may be possible to use, e.g., a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation: MCPMDS) gas, or the like. FIG. 15A illustrates a chemical structural formula of TCDMDS, FIG. 15B illustrates a chemical structural formula of DCTMDS, and FIG. 15C illustrates a chemical structural formula of MCPMDS. These gases may be referred to as precursor gases which contain at least two Si atoms in one molecule and contain C and Cl and which have a Si—C bond. These gases further contain a Si—Si bond. These gases act as Si sources and C sources in a substrate processing process which will be described later.

In the case of using a liquid precursor, such as HCDS, BTCSM, TCDMDS or the like, which stays in a liquid state under a room temperature and an atmospheric pressure, the liquid precursor is vaporized by a vaporization system such as a vaporizer or a bubbler and is supplied as a precursor gas (a HCDS gas, a BTCSM gas, a TCDMDS gas, etc.).

A reaction gas differing in chemical structure from the precursor gas, for example, a carbon (C)-containing gas, is supplied from the gas supply pipe 232a into the process chamber 201 via the MFC 241a, the valve 243a and the nozzle 249a. As the C-containing gas, it may be possible to use, e.g., a hydrocarbon-based gas. The hydrocarbon-based gas may be referred to as a substance consisting of only two elements C and H. The hydrocarbon-based gas acts as a C source in a substrate processing procedure which will be described later. As the hydrocarbon-based gas, it may be possible to use, e.g., a propylene ($C_3H_6$) gas.

A reaction gas differing in chemical structure from the precursor gas, for example, an oxygen (O)-containing gas, is supplied from the gas supply pipe 232b into the process chamber 201 via the MFC 241b, the valve 243b and the nozzle 249b. The O-containing gas acts as an oxidizing gas, namely an O source, in a substrate processing procedure which will be described later. As the O-containing gas, it may be possible to use, e.g., an oxygen ($O_2$) gas.

A reaction gas differing in chemical structure from the precursor gas, for example, a hydrogen (H)-containing gas, is supplied from the gas supply pipe 232b into the process chamber 201 via the MFC 241b, the valve 243b and the nozzle 249b.

As the H-containing gas, it may be possible to use, e.g., a hydrogen nitride-based gas which is a gas containing nitrogen (N) and hydrogen (H). The hydrogen nitride-based gas may be referred to as a substance consisting of only two elements N and H or may be referred to as a nitrogen (N)-containing gas. The nitrogen (N)-containing gas acts as a nitriding gas, namely an N source in a substrate processing procedure which will be described later. As the hydrogen nitride-based gas, it may be possible to use, e.g., an ammonia ($NH_3$) gas.

Furthermore, as the H-containing gas, it may also be possible to use, e.g., an amine-based gas which is a gas containing N, C and H. The amine-based gas may be referred to as a substance consisting of only three elements C, N and H or may be referred to as an N- and C-containing gas. The amine-based gas acts as an N source and a C source in a substrate processing procedure which will be described later. As the amine-based gas, it may be possible to use, e.g., a triethylamine (($C_2H_5)_3N$, abbreviation: TEA) gas. In the case of using amine, such as TEA or the like, which stays in a liquid state under a room temperature and an atmospheric pressure, the liquid amine is vaporized by a vaporization system such as a vaporizer or a bubbler and is supplied as an amine-based gas (a TEA gas).

Moreover, as the H-containing gas, it may also be possible to use, e.g., an organic hydrazine-based gas which is a gas containing N, C and H. The organic hydrazine-based gas may be referred to as a substance consisting of only three elements C, N and H or may be referred to as an N- and C-containing gas. The organic hydrazine-based gas acts as an N source and a C source in a substrate processing procedure which will be described later. As the organic hydrazine-based gas, it may be possible to use, e.g., a trimethylhydrazine (($CH_3)_2N_2(CH_3)H$, abbreviation: TMH) gas. In the case of using amine, such as TMH or the like, which stays in a liquid state under a room temperature and an atmospheric pressure, the liquid amine is vaporized by a vaporization system such as a vaporizer or a bubbler and is supplied as an organic hydrazine-based gas (a TMH gas).

In addition, as the H-containing gas, it may be possible to use, e.g., an N- or C-free gas such as a hydrogen ($H_2$) gas, a deuterium ($D_2$) gas or the like.

An inert gas, for example, a nitrogen ($N_2$) gas, is supplied from the gas supply pipes 232c and 232d into the process chamber 201 via the MFCs 241c and 241d, the valves 243c and 243d, the gas supply pipes 232a and 232b, and the nozzles 249a and 249b.

In the case of supplying the precursor gas from the gas supply pipe 232a, a precursor gas supply system is mainly configured by the gas supply pipe 232a, the MFC 241a, and the valve 243a. The precursor gas supply system may also include the nozzle 249a. The precursor gas supply system may be referred to as a precursor supply system. In the case of supplying a halosilane precursor gas from the gas supply pipe 232a, the precursor gas supply system may be referred to as a halosilane precursor gas supply system or a halosilane precursor supply system.

In the case of supplying the C-containing gas from the gas supply pipe 232a, a C-containing gas supply system is mainly configured by the gas supply pipe 232a, the MFC 241a, and the valve 243a. The C-containing gas supply system may also include the nozzle 249a. In the case of supplying a hydrocarbon-based gas from the gas supply pipe 232a, the C-containing gas supply system may be referred to as a hydrocarbon-based gas supply system or a hydrocarbon supply system.

In the case of supplying the O-containing gas from the gas supply pipe 232b, an O-containing gas supply system is mainly configured by the gas supply pipe 232b, the MFC 241b, and the valve 243b. The O-containing gas supply system may also include the nozzle 249b. The O-containing gas supply system may be referred to as an oxidizing gas supply system or an oxidant supply system.

In the case of supplying the H-containing gas from the gas supply pipe 232b, an H-containing gas supply system is mainly configured by the gas supply pipe 232b, the MFC 241b, and the valve 243b. The H-containing gas supply system may also include the nozzle 249b. In the case of supplying an N- and H-containing gas from the gas supply pipe 232b, the H-containing gas supply system may be referred to as an N-containing gas supply system or an N- and H-containing gas supply system. Furthermore, in the case of supplying an N-, C- and H-containing gas from the gas supply pipe 232b, the H-containing gas supply system may be referred to as an N-containing gas supply system, a C-containing gas supply system, or an N- and C-containing gas supply system. The N-containing gas supply system may be referred to as a nitriding gas supply system or a nitriding agent supply system. In the case of using a hydrogen nitride-based gas, an amine-based gas or an organic hydrazine-based gas as the H-containing gas, the H-containing gas supply system may be referred to as a hydrogen nitride-based gas supply system, an amine-based gas supply system, or an organic hydrazine-based gas supply system.

One or all of the C-containing gas supply system, the O-containing gas supply system and the H-containing gas supply system may be referred to as a reaction gas supply system or a reactant supply system.

In addition, an inert gas supply system is mainly configured by the gas supply pipes 232c and 232d, the MFCs 241c and 241d and the valves 243c and 243d. The inert gas supply system may be referred to as a purge gas supply system, a dilution gas supply system, or a carrier gas supply system.

An exhaust pipe 231 for exhausting an internal atmosphere of the process chamber 201 is installed in the reaction tube 203. A vacuum exhaust device, e.g., a vacuum pump 246, is connected to the exhaust pipe 231 via a pressure sensor 245, which is a pressure detector (pressure detecting part) for detecting an internal pressure of the process chamber 201, and an Auto Pressure Controller (APC) valve 244, which is a pressure regulator (pressure regulating part). The APC valve 244 is configured to perform or stop vacuum exhaust in the process chamber 201 by opening or closing the valve while the vacuum pump 246 is actuated and is also configured to regulate the internal pressure of the process chamber 201 by adjusting an opening degree of the valve pursuant to pressure information detected by the pressure sensor 245 while the vacuum pump 246 is actuated. An exhaust system includes the exhaust pipe 231, the APC valve 244, and the pressure sensor 245. The vacuum pump 246 may be included in the exhaust system.

A seal cap 219, which serves as a furnace opening cover configured to hermetically seal a lower end opening of the reaction tube 203, is installed under the reaction tube 203. The seal cap 219 is configured to make contact with the lower end of the reaction tube 203 at a lower side in the vertical direction. The seal cap 219 is made of metal such as, e.g., stainless steel or the like, and is formed into a disc shape. An O-ring 220, which is a seal member making contact with the lower end portion of the reaction tube 203, is installed on an upper surface of the seal cap 219. A rotary mechanism 267 configured to rotate a boat 217, which will be described later is installed at a side of the seal cap 219 apposite to the process chamber 201. A rotary shaft 255 of the rotary mechanism 267, which penetrates through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. As such, the boat elevator 115 is configured as a transfer device (transfer mechanism) which transfers the boat 217, ultimately, the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and in multiple stages along a vertical direction, with the centers of the wafers 200 concentrically aligned, to be spaced-apart from one another. The boat 217 is made of heat resistant material such as quartz or SiC. Heat insulating plates 218 made of heat resistant material such as quartz or SiC are installed below the boat 217 in a horizontal posture and in multiple stages. With this configuration, it is hard for heat generated from the heater 207 to be transferred to the seal cap 219. However, the present embodiment is not limited to the above-described configuration. For example, instead of installing the heat insulating plates 218 below the boat 217, a heat insulating tube as a tubular member made of heat resistant material such as quartz or SiC may be installed below the boat 217.

A temperature sensor 263 serving as a temperature detector is installed in the reaction tube 203. Based on temperature information detected by the temperature sensor 263, a state of supplying electronic power to the heater 207 is adjusted such that the interior of the process chamber 201 has a desired or specified temperature distribution. Similar to the nozzles 249a and 249b, the temperature sensor 263 is formed in an L-shape. The temperature sensor 263 is installed along the inner wall of the reaction tube 203.

Figure 3:
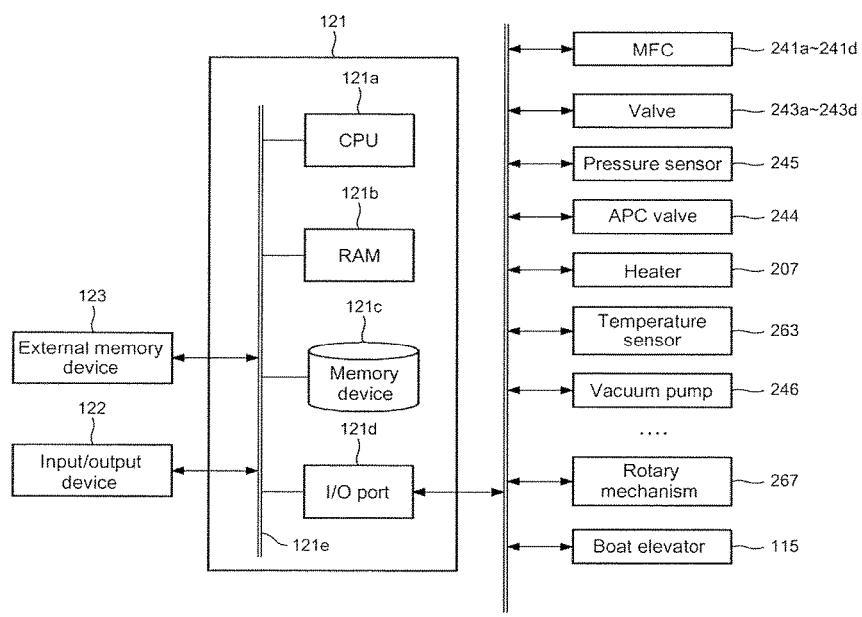
FIG. 3 is a schematic configuration view of a controller of the substrate processing apparatus suitably used in one embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disc drive (HDD), or the like. A control program for controlling operations of a substrate processing apparatus or a process recipe, in which a sequence or condition for processing a substrate to be described later is written, is readably stored in the memory device 121c. Also, the process recipe functions as a program for the controller 121 to execute each sequence in the substrate processing procedure, which will be described later, to obtain a predetermined result. Hereinafter, such a process recipe or control program may be generally referred to as "a program." Also, when the term "program" is used herein, it may indicate a case of including only a process recipe, a case of including only a control program, or a case of including both a process recipe and a control program. In addition, the RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotary mechanism 267, the boat elevator 115, and the like.

The CPU 121a is configured to read and execute the control program from the memory device 121c. The CPU 121a also reads the process recipe from the memory device 121c according to an input of an operation command from the input/output device 122. In addition, the CPU 121a is configured to control the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the start/stop operation of the vacuum pump 246, the temperature adjusting operation performed by the heater 207 based on the temperature sensor 263, the power supply operation of the high-frequency power source 273, the impedance adjusting operation performed by the matcher 272, the operation of rotating the boat 217 with the rotary mechanism 267 and adjusting the rotation speed of the boat 217, the operation of moving the boat 217 up and down with the boat elevator 115, and the like, according to contents of the read process recipe.

Moreover, the controller 121 is not limited to being configured as a dedicated computer but may be configured as a general-purpose computer. For example, the controller 121 according to the present embodiment may be configured by preparing an external memory device 123 (for example, a magnetic tape, a magnetic disc such as a flexible disc or a hard disc, an optical disc such as a CD or DVD, a magneto-optical disc such as an MO, a semiconductor memory such as a USB memory or a memory card), in which the program is stored, and installing the program on the general-purpose computer using the external memory device 123. Also, means for providing the program to the computer is not limited to the case in which the program is provided through the external memory device 123. For example, the program may be supplied using communication means such as the Internet or a dedicated line, rather than through the external memory device 123. Also, the memory device 121c or the external memory device 123 is configured as a non-transitory computer-readable recording medium. Hereinafter, the means for supplying the program will be simply referred to as a "recording medium." In addition, when the term "recording medium" is used herein, it may indicate a case of including only the memory device 121c, a case of including only the external memory device 123, or a case of including both the memory device 121c and the external memory device 123.

(2) Substrate Processing Process

An example of a procedure for forming a thin film on a substrate, which is one of the procedures for manufacturing a semiconductor device by using the above described substrate processing apparatus, is described below with reference to FIGS. 4 to 7. In the following descriptions, the operations of the respective units or parts constituting the substrate processing apparatus are controlled by the controller 121.

In a film forming sequence illustrated in FIGS. 4 to 7, a Si-, O-, C- and N-containing film, namely a silicon oxycarbonitride film (SiOCN film), is formed on a wafer 200 by performing, a predetermined number of times (n times), a cycle that non-simultaneously, i.e., non-synchronously performs:

Step 1 of supplying an HCDS gas as a precursor gas to the wafer 200 as a substrate accommodated within a process chamber 201;

Step 1p of exhausting the HCDS gas from an interior of the process chamber 201;

Step 2 of supplying a $C_3H_6$ gas as a C-containing gas to the wafer 200 accommodated within the process chamber 201;

Step 2p of exhausting the $C_3H_6$ gas from the interior of the process chamber 201;

Step 3 of supplying an $O_2$ gas as an O-containing gas to the wafer 200 accommodated within the process chamber 201;

Step 3p of exhausting the $O_2$ gas from the interior of the process chamber 201;

Step 4 of supplying an $NH_3$ gas as a H-containing gas to the wafer 200 accommodated within the process chamber 201; and Step 4p of exhausting the $NH_3$ gas from the interior of the process chamber 201.

The SiOCN film may also be referred to as a C-containing silicon oxynitride film (SiON film), a C-added (doped) SiON film, or a C-containing SiON film.

When performing the aforementioned cycle a predetermined number of times, at least one of the gas exhaust effect (e.g., an amount of an exhausted gas) and the gas exhaust efficiency (e.g., an amount of an exhausted gas per time, i.e., exhaust rate) at Step 3p of exhausting the $O_2$ gas and at Step 4p of exhausting the $NH_3$ gas is made larger than at least one of the gas exhaust effect and the gas exhaust efficiency Step 1p of exhausting the HCDS gas and at Step 2p of exhausting the $C_3H_6$ gas.

That is to say, the gas exhaust effect at Step 3p and the gas exhaust effect at Step 4p are respectively made larger than the gas exhaust effect at Step 1p and the gas exhaust effect at Step 2p.

Alternatively, the gas exhaust efficiency at Step 3p and the gas exhaust efficiency at Step 4p are respectively made larger than the gas exhaust efficiency at Step 1p and the gas exhaust efficiency at Step 2p.

Alternatively, the gas exhaust effect at Step 3p and the gas exhaust effect at Step 4p are respectively made larger than the gas exhaust effect at Step 1p and the gas exhaust effect at Step 2p, and the gas exhaust efficiency at Step 3p and the gas exhaust efficiency at Step 4p are respectively made larger than the gas exhaust efficiency at Step 1p and the gas exhaust efficiency at Step 2p.

In the subject specification, for the sake of convenience, the aforementioned film forming sequence may sometimes be denoted as follows.

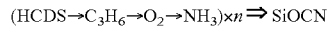

$(HCDS \rightarrow C_3H_6 \rightarrow O_2 \rightarrow NH_3) \times n \Rightarrow SiOCN$ As used herein, the term "wafer" may refer to "a wafer itself" or "a wafer and a laminated body (a collected body) of predetermined layers or films formed on a surface of the wafer" (i.e., a wafer including predetermined layers or films formed on its surface may be referred to as a wafer). In addition, as used herein, the phrase "a surface of a wafer" may refer to "a surface (exposed surface) of a wafer itself" or "a surface of a predetermined layer or film formed on a wafer, namely an uppermost surface of the wafer, which is a laminated body".

As such, as used herein, the phrase "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the phrase "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, the term "wafer" and "substrate" may be used interchangeably in the above descriptions.

(Wafer Charging and Boat Loading)

When the plurality of wafers 200 is charged on the boat 217 (wafer charging) as illustrated in FIG. 1, the boat 217 charged with the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

An internal pressure of the process chamber 201, namely the space in which the wafers 200 exist is vacuum-exhausted (depressurization-exhausted) by the vacuum pump 246 to reach a desired or specified pressure (desired or specified vacuum level). In this operation, the internal pressure of the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired or specified temperature. In this operation, the state of supplying electric power to the heater 207 is feedback-controlled based on the temperature information detected by the temperature sensor 263 such that the interior of the process chamber 201 reaches a desired or specified temperature distribution. In addition, the heating of the interior of the process chamber 201 by the heater 207 may be continuously performed at least until the processing of the wafers 200 is completed. The boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(SiOCN Film Forming Process)

Next, the following eight steps, i.e., Steps 1 and 1p, Steps 1 and 2p, Steps 3 and 3p, and Steps 4 and 4p, are sequentially performed.

[Step 1 (HCDS Gas Supply)]

At this step, a HCDS gas is supplied to the wafer 200 accommodated within the process chamber 201.

The valve 243a is opened to flow a HCDS gas through the gas supply pipe 232a. The HCDS gas is flow rate-adjusted by the MFC 241a. The HCDS gas is supplied into the process chamber 201 via the nozzle 249a and is exhausted from the exhaust pipe 231. At this time, the HCDS gas is supplied to the wafer 200. At the same time, the valve 243c is opened to flow a $N_2$ gas through the gas supply pipe 232c. The $N_2$ gas is flow rate-adjusted by the MFC 241c. The flow rate-adjusted $N_2$ gas is supplied into the process chamber 201 together with the HCDS gas and is exhausted from the exhaust pipe 231.

In order to prevent the HCDS gas from infiltrating into the nozzle 249b, the valves 243d is opened to flow the $N_2$ gas through the gas supply pipe 232d. The $N_2$ gas is supplied into the process chamber 201 through the gas supply pipe 232b and the nozzle 249b and is exhausted from the exhaust pipe 231.

A supply flow rate of the HCDS gas controlled by the MFC 241a is set to fall within a range of, e.g., 1 to 2,000 sccm, specifically, 10 to 1,000 sccm. Each of supply flow rates of the $N_2$ gas controlled by the MFCs 241c and 241d is set to fall within a range of, e.g., 100 to 10,000 sccm. An internal pressure of the process chamber 201 is set to fall within a range of, e.g., 1 to 2,666 Pa, specifically 67 to 1,333 Pa. A time period for supplying the HCDS gas to the wafer 200, namely the gas supply time (irradiation time), is set to fall within a range of, e.g., 1 to 120 seconds, specifically, 1 to 60 seconds. The temperature of the heater 207 is set such that the temperature of the wafer 200 falls within a range of, e.g., 250 to 700 degrees C., specifically 300 to 650 degrees C., more specifically 350 to 600 degrees C.

If the temperature of the wafer 200 becomes lower than 250 degrees C., the HCDS gas is hardly chemisorbed onto the wafer 200. Thus, there may be a case where a practical deposition rate is not obtained. This problem may be solved by setting the temperature of the wafer 200 at 250 degrees C. or higher. By setting the temperature of the wafer 200 at 300 degrees C. or higher, ultimately at 350 degrees C. or higher, it is possible to allow the HCDS gas to be sufficiently adsorbed onto the wafer 200. Thus, a sufficient deposition rate is obtained.

If the temperature of the wafer 200 exceeds 700 degrees C., a CVD reaction becomes too strong (an excessive gas phase reaction is generated). Thus, the film thickness uniformity is easily deteriorated and is hardly controlled. By setting the temperature of the wafer 200 at 700 degrees C. or lower, it is possible to generate a suitable gas phase reaction. This makes it possible to suppress deterioration of the film thickness uniformity and to control the film thickness uniformity. Particularly, if the temperature of the wafer 200 is set at 650 degrees C. or lower, ultimately at 600 degrees C. or lower, a surface reaction becomes more dominant than a gas phase reaction. This makes it easy to secure the film thickness uniformity and to control the film thickness uniformity.

Accordingly, the temperature of the wafer 200 may be set to fall within a range of 250 to 700 degrees C., specifically 300 to 650 degrees C., more specifically 350 to 600 degrees C.

By supplying the HCDS gas to the wafer 200 under the aforementioned conditions, a first layer, for example, a Cl- and Si-containing layer having a thickness of less than one atomic layer to several atomic layers, is formed on the uppermost surface of the wafer 200. The Cl- and Si-containing layer may include a Cl-containing Si layer, an adsorption layer of HCDS, or both.

The Cl-containing Si layer is a generic name that encompasses a continuous or discontinuous layer containing Cl, which is composed of Si, and a Si thin film containing Cl, which is formed of the layers overlapping with one another. The continuous layer containing Cl, which is composed of Si, is sometimes referred to as a Si thin film containing Cl. The Si which constitutes the Si layer containing Cl includes not only Si whose bond to Cl is not completely broken, but also Si whose bond to Cl is completely broken.

The adsorption layer of HCDS includes not only a continuous adsorption layer composed of HCDS molecules but also a discontinuous adsorption layer. That is to say, the adsorption layer of HCDS includes an adsorption layer having a thickness of one molecular layer or less than one molecular layer, which is composed of HCDS molecules. The HCDS molecules that constitute the adsorption layer of HCDS include a molecule in which Si—Cl bonds are partially broken. That is to say, the adsorption layer of HCDS may include a physical adsorption layer of HCDS, a chemisorption layer of HCDS, or both.

In this regard, the layer having a thickness of less than one atomic layer may mean an atomic layer that is discontinuously formed. The layer having a thickness of one atomic layer may mean an atomic layer that is continuously formed. The layer having a thickness of less than one molecular layer may mean a molecular layer that is discontinuously formed. The layer having a thickness of one molecular layer may mean a molecular layer that is continuously formed. The Si-containing layer containing Cl may include both a Si layer containing Cl and an adsorption layer of HCDS. As described above, expressions such as "one atomic layer", "several atomic layers" and the like will be used with respect to the Cl- and Si-containing layer.

Under a condition in which the HCDS gas is autolyzed (or pyrolyzed), i.e., a condition in which a pyrolysis reaction of the HCDS gas is generated, Si is deposited on the wafer 200 to form a Si layer containing Cl. Under a condition in which the HCDS gas is not autolyzed (or pyrolyzed), i.e., a condition in which a pyrolysis reaction of the HCDS gas is not generated, HCDS is adsorbed onto the wafer 200 to form an adsorption layer of HCDS. From the viewpoint of increasing the deposition rate, it may be more advantageous to form the Si layer containing Cl on the wafer 200 than to form the adsorption layer of HCDS on the wafer 200.

If the thickness of the first layer exceeds several atomic layers, a modifying reaction at Steps 3 and 4, which will be described later, does not affect the entire first layer. In addition, a minimum value of the thickness of the first layer is less than one atomic layer. Accordingly, the thickness of the first layer may be set to fall within a range of less than one atomic layer to several atomic layers. By setting the thickness of the first layer to become one atomic layer or less, namely one atomic layer or less than one atomic layer, it is possible to relatively increase the action of a modifying reaction at Steps 3 and 4 which will be described later and to shorten the time required in a modifying reaction at Steps 3 and 4. It is also possible to shorten the time required in the formation of the first layer at Step 1. Consequently, it is possible to shorten the processing time per one cycle. This makes it possible to shorten the total processing time. That is to say, it is possible to increase the deposition rate. Furthermore, by setting the thickness of the first layer to become one atomic layer or less, it is possible to enhance the controllability of the film thickness uniformity.

As the precursor gas, in addition to the HCDS gas, it may be possible to use, e.g., an inorganic halosilane precursor gas such as an OCTS gas, a dichlorosilane ($SiH_2Cl_2$, abbreviation: DCS) gas, a monochlorosilane ($SiH_3Cl$, abbreviation: MCS) gas, a tetrachlorosilane, i.e., silicon tetrachloride ($SiCl_4$, abbreviation: STC) gas, a trichlorosilane ($SiHCl_3$, abbreviation: TCS) gas, or the like.

Furthermore, as the precursor gas, it may be possible to use an organic halosilane precursor gas such as a BTCSE gas, a BTCSM gas, a TCDMDS gas, a DCTMDS gas, an MCPMDS gas, or the like.

Furthermore, as the precursor gas, it may be possible to use, e.g., a halogen-group-free inorganic silane precursor gas such as a monosilane ($SiH_4$, abbreviation: MS) gas, a disilane ($Si_2H_6$, abbreviation: DS) gas, a trisilane ($Si_3H_8$, abbreviation: TS) gas, or the like.

Furthermore, as the precursor gas, it may be possible to use, e.g., a halogen-group-free organic silane precursor gas such as a dimethyl silane ($SiC_2H_8$, abbreviation: DMS) gas, a trimethyl silane ($SiC_3H_{10}$, abbreviation; TMS) gas, a diethyl silane ($SiC_4H_{12}$, abbreviation: DES) gas, a 1,4-disilane butane ($Si_2C_2H_{10}$, abbreviation: DSB) gas, or the like.

Furthermore, as the precursor gas, it may be possible to use, e.g., a halogen-group-free amino-based (amine-based) silane precursor gas such as a trisdimethylaminosilane ($Si[N(CH_3)_2]_3H$, abbreviation: 3DMAS) gas, a tetrakisdimethylaminosilane ($Si[N(CH_3)_2]_4$, abbreviation: 4DMAS) gas, a bisdiethylaminosilane ($Si[N(C_2H_5)_2]_2H_2$, abbreviation: BDEAS) gas, a bis-tert-butylaminosilane ($SiH_2[NH(C_4H_9)]_2$, abbreviation: BTBAS) gas, or the like.

In the case where an organic halosilane precursor gas or an organic silane precursor gas acting as a C source is used as the precursor gas, it is possible to have C contained in the first layer. Consequently, the C concentration in the SiOCN film finally formed on the wafer 200 can be made higher than when an inorganic halosilane precursor gas or an inorganic silane precursor gas is used as the precursor gas. In the case where an aminosilane precursor gas acting as a C source and an N source is used as the precursor gas, it is possible to have C and N contained in the first layer. Consequently, the C concentration in the SiOCN film finally formed on the wafer 200 can be made higher than when an inorganic silane precursor gas is used as the precursor gas.

[Step 1p (HCDS Gas Exhaust)]

After the first layer is formed, the valve 243a is closed to stop the supply of the HCDS gas. At this time, the APC valve 244 is kept opened and the interior of the process chamber 201 is evacuated by the vacuum pump 246. The HCDS gas remaining within the process chamber 201, which has not reacted or which has contributed to the formation of the first layer, is exhausted from the interior of the process chamber 201. At this time, the valves 243c and 243d are kept opened to continuously supply the $N_2$ gas into the process chamber 201. The $N_2$ gas acts as a purge gas. This makes it possible to effectively exhaust the gas remaining within the process chamber 201 from the interior of the process chamber 201.

In this case, the gas remaining within the process chamber 201 may not be completely exhausted and the interior of the process chamber 201 may not be completely purged. If the amount of the gas remaining within the process chamber 201 is small, an adverse effect may not be generated at Step 2 which will be subsequently performed. The flow rate of the $N_2$ gas supplied into the process chamber 201 need not be made large. For example, an amount of the $N_2$ gas to be supplied into the process chamber 201 may be set substantially equal to the volume of the reaction tube 203 (the process chamber 201) such that a purge operation is performed without causing an adverse effect at Step 2. As such, by not completely purging the interior of the process chamber 201, it is possible to shorten the purge time and to improve the throughput. It is also possible to suppress the consumption of the $N_2$ gas to a necessary minimum level.

As the inert gas, in addition to the $N_2$ gas, it may be possible to use, e.g., a rare gas such as an Ar gas, a He gas, a Ne gas, a Xe gas or the like.

[Step 2 ($C_3H_6$ Gas Supply)]

After Step 1p is completed, a thermally-activated $C_3H_6$ gas is supplied to the wafer 200 accommodated within the process chamber 201, namely the first layer formed on the wafer 200.

At this step, the opening/closing control of the valves 243a, 243c and 243d is performed in the same procedure as the opening/closing control of the valves 243a, 243c and 243d performed at Step 1. The flow rate of the $C_3H_6$ gas is adjusted by the MFC 241a. The $C_3H_6$ gas is supplied into the process chamber 201 via the nozzle 249a and is exhausted from the exhaust pipe 231. At this time, the $C_3H_6$ gas is supplied to the wafer 200.

The supply flow rate of the $C_3H_6$ gas controlled by the MFC 241a is set to fall within a range of, e.g., 100 to 10,000 sccm. The internal pressure of the process chamber 201 is set to fall within a range of, e.g., 1 to 5,000 Pa, specifically 1 to 4,000 Pa. The partial pressure of the $C_3H_6$ gas within the process chamber 201 is set to fall within a range of, e.g., 0.01 to 4,950 Pa. By setting the internal pressure of the process chamber 201 to fall within such a relatively high pressure zone, it is possible to thermally activate the $C_3H_6$ gas in a non-plasma manner. If the $C_3H_6$ gas is supplied by thermally activating the same, it is possible to generate a relatively soft reaction. This makes it easy to form a C-containing layer which will be described later. A time period for supplying the $C_3H_6$ gas to the wafer 200, namely the gas supply time (irradiation time), is set to fall within a range of, e.g., 1 to 200 seconds, specifically, 1 to 120 seconds, more specifically 1 to 60 seconds. Other processing conditions may be similar to, e.g., the processing conditions of Step 1.

At this time, the gas flowing into the process chamber 201 is a thermally-activated $C_3H_6$ gas. The HCDS gas does not flow into the process chamber 201. Accordingly, the $C_3H_6$ gas does not make a gas phase reaction and is supplied to the wafer 200 in an activated state. As a result, a carbon-containing layer (C-containing layer) is formed on the surface of the first layer, namely the Cl- and Si-containing layer, formed on the wafer 200 at Step 1. The C-containing layer may include a C layer, an adsorption layer of $C_3H_6$, or both. The C-containing layer becomes a layer having a thickness of less than one molecular layer or less than one atomic layer, namely a discontinuous layer. Thus, a second layer containing Si, Cl and C is formed on the uppermost surface of the wafer 200. The second layer becomes a layer which includes the Cl- and Si-containing layer and the C-containing layer. Depending on the conditions, there may be a case where the first layer is modified (carbonized) by the reaction of a portion of the first layer and the $C_3H_6$ gas and a SiC layer is included in the second layer.

The C-containing layer needs to be a discontinuous layer. If the C-containing layer is a continuous layer, the surface of the Cl- and Si-containing layer is totally covered with the C-containing layer. In this case, Si does not exist on the surface of the second layer. As a result, there may be a case where the oxidizing reaction of the second layer at Step 3 to be described later and the nitriding reaction of a third layer at Step 4 to be described later are difficult to occur. This is because, under the above-described processing conditions, O or N is bonded to Si and is hardly bonded to C. In order to generate a desired or specified reaction at Step 3 or 4 which will be described later, the adsorption state of the C-containing layer onto the Cl- and Si-containing layer needs to be an unsaturated state, and Si needs to be exposed on the surface of the second layer. In addition, by setting the processing conditions at Step 2 to fall within the range of the aforementioned processing conditions, it is possible to make the C-containing layer become a discontinuous layer.

As the C-containing gas, in addition to the $C_3H_6$ gas, it may be possible to use a hydrocarbon-based gas such as an acetylene ($C_2H_2$) gas, an ethylene ($C_2H_4$) gas or the like.

[Step 2p ($C_3H_6$ Gas Exhaust)]

After the second layer is formed, the valve 243a is closed to stop the supply of the $C_3H_6$ gas. Then, with the processing procedures and processing conditions similar to those of Step 1p, the $C_3H_6$ gas remaining within the process chamber 201, which has not reacted or which has contributed to the formation of the C-containing layer, or the reaction byproduct is exhausted from the interior of the process chamber 201. Similar to Step 1p, the gas remaining within the process chamber 201 may not be completely exhausted. As the inert gas, in addition to the $N_2$ gas, it may be possible to use, e.g., various kinds of rare gases illustrated at Step 1.

[Step 3 ($O_2$ Gas Supply)]

After Step 2p is completed, a thermally-activated $O_2$ gas is supplied to the wafer 200 accommodated within the process chamber 201, namely the second layer formed on the wafer 200.

At this step, the opening/closing control of the valves 243b to 243d is performed in the same procedure as the opening/closing control of the valves 243a, 243c and 243d performed at Step 1. The flow rate of the $O_2$ gas is adjusted by the MFC 241b. The $O_2$ gas is supplied into the process chamber 201 via the nozzle 249b and is exhausted from the exhaust pipe 231. At this time, the $O_2$ gas is supplied to the wafer 200.

The supply flow rate of the $O_2$ gas controlled by the MFC 241b is set to fall within a range of, e.g., 100 to 10,000 sccm. The internal pressure of the process chamber 201 is set to fall within a range of, e.g., 1 to 4,000 Pa, specifically 1 to 3,000 Pa. The partial pressure of the $O_2$ gas within the process chamber 201 is set to fall within a range of, e.g., 0.01 to 3,960 Pa. By setting the internal pressure of the process chamber 201 to fall within such a relatively high pressure zone, it is possible to thermally activate the $O_2$ gas in a non-plasma manner. If the $O_2$ gas is supplied by thermally activating the same, it is possible to generate a relatively soft reaction. This makes it possible to softly perform the oxidation which will be described later. A time period for supplying the $O_2$ gas to the wafer 200, namely the gas supply time (irradiation time), is set to fall within a range of, e.g., 1 to 120 seconds, specifically, 1 to 60 seconds. Other processing conditions may be similar to, e.g., the processing conditions of Step 1.

At this time, the gas flowing into the process chamber 201 is a thermally-activated $O_2$ gas. The HCDS gas and the $C_3H_6$ gas do not flow into the process chamber 201. Accordingly, the $O_2$ gas does not make a gas phase reaction and is supplied to the wafer 200 in an activated state. The $O_2$ gas supplied to the wafer 200 reacts with at least a portion of the Si-, Cl- and C-containing second layer (the layer including the Cl- and Si-containing layer and the C-containing layer) formed on the wafer 200 at Step 2. Thus, the second layer is thermally oxidized in a non-plasma manner and is changed (modified) into a Si-, O- and C-containing third layer, namely a silicon oxycarbide layer (SiOC layer). When forming the third layer, the impurities such as Cl and the like contained in the second layer make up a gaseous material containing at least Cl in the course of the modifying reaction generated by the $O_2$ gas. The gaseous material is exhausted from the interior of the process chamber 201. That is to say, the impurities such as Cl and the like contained in the second layer are extracted or desorbed from the second layer and are separated from the second layer. Thus, the third layer becomes a layer which is smaller in the amount of the impurities such as Cl and the like than the second layer.

At this time, the oxidizing reaction of the second layer is not saturated. For example, if the Cl- and Si-containing layer having a thickness of several atomic layers is formed at Step 1 and if the C-containing layer having a thickness of less than one atomic layer is formed at Step 2, at least a portion of the surface layer (the one atomic layer of the surface) is oxidized. In this case, in order not to oxidize the entire second layer, oxidation is performed under a condition in which the oxidizing reaction of the second layer is unsaturated. Depending on the conditions, some layers existing below the surface layer of the second layer may be oxidized. However, from the viewpoint of enhancing the controllability of a composition ratio of a SiOCN film finally formed on the wafer 200, it is advisable to oxidize only the surface layer. Furthermore, for example, even if the Cl- and Si-containing layer having a thickness of one atomic layer or less than one atomic layer is formed at Step 1 and even if the C-containing layer having a thickness of less than one atomic layer is formed at Step 2, a portion of the surface layer is similarly oxidized. Even in this case, in order not to oxidize the entire second layer, oxidation is performed under a condition in which the oxidizing reaction of the second layer is unsaturated. In addition, by setting the processing conditions at Step 3 to fall within the range of the aforementioned processing conditions, it is possible to make the oxidizing reaction of the second layer unsaturated.

At this time, in particular, the aforementioned processing conditions may be adjusted so as to increase a dilution ratio of the $O_2$ gas (to reduce the concentration of the $O_2$ gas), or to shorten the supply time of the $O_2$ gas, or to reduce the partial pressure of the $O_2$ gas. For example, as compared with Steps 2 and 4, the dilution ratio of the reaction gas may be increased, the supply time of the reaction gas may be shortened, or the partial pressure of the reaction gas may be reduced. This makes it possible to moderately lower the oxidizing power at Step 3. It also becomes easier to make the oxidizing reaction unsaturated.

By lowering the oxidizing power at Step 3, it becomes possible to suppress desorption of C from the second layer in the oxidizing process. Since a Si—O bond is larger in bonding energy than a Si—C bond, there is a tendency that, if the Si—O bond is formed, the Si—C bond is broken. In contrast, by moderately lowering the oxidizing power at Step 3, it is possible to restrain the Si—C bond from being broken when forming the Si—O bond within the second layer. This makes it possible to restrain C whose bond to Si is broken, from being desorbed from the second layer.

Furthermore, by lowering the oxidizing power at Step 3, it is possible to keep Si exposed on the uppermost surface of the oxidized second layer, i.e., the third layer. By keeping Si exposed on the uppermost surface of the third layer, it becomes easy to nitride the uppermost surface of the third layer at Step 4 which will be described later. In a state in which the Si—O bond or the Si—C bond is formed over the entire uppermost surface of the third layer and in which Si is not exposed on the uppermost surface, there is a tendency that a Si—N bond hardly formed under the conditions of Step 4. However, by keeping Si exposed on the uppermost surface of the third layer, namely by allowing Si, which is capable of making a bond with N under the conditions of Step 4 to be described later, to exist on the uppermost surface of the third layer, it becomes easy to form a Si—N bond.

As the oxidizing gas, in addition to the $O_2$ gas, it may be possible to use an O-containing gas such as a water vapor ($H_2O$ gas), a nitric monoxide (NO) gas, a nitrous oxide ($N_2O$) gas, a nitrogen dioxide ($NO_2$) gas, a carbon monoxide (CO) gas, a carbon dioxide ($CO_2$) gas, an ozone (O3) gas or the like.

[Step 3p ($O_2$ Gas Exhaust)]

After the third layer is formed, the valve 243b is closed to stop the supply of the $O_2$ gas. Then, the $O_2$ gas remaining within the process chamber 201, which has not reacted or which has contributed to the formation of the third layer, or the reaction byproduct is exhausted from the interior of the process chamber 201. The processing procedures and the processing conditions used at this time will be described later. As the inert gas, in addition to the $N_2$ gas, it may be possible to use, e.g., various kinds of rare gases illustrated at Step 1p.

[Step 4 ($NH_3$ Gas Supply)]

After Step 3p is completed, a thermally-activated $NH_3$ gas is supplied to the wafer 200 accommodated within the process chamber 201, namely the third layer formed on the wafer 200.

At this step, the opening/closing control of the valves 243b to 243d is performed in the same procedure as the opening/closing control of the valves 243a, 243c and 243d performed at Step 1. The flow rate of the $NH_3$ gas is adjusted by the MFC 241b. The $NH_3$ gas is supplied into the process chamber 201 via the nozzle 249b and is exhausted from the exhaust pipe 231. At this time, the $NH_3$ gas is supplied to the wafer 200.

The supply flow rate of the $NH_3$ gas controlled by the MFC 241b is set to fall within a range of, e.g., 100 to 10,000 sccm. The internal pressure of the process chamber 201 is set to fall within a range of, e.g., 1 to 4,000 Pa, specifically 1 to 3,000 Pa. The partial pressure of the $NH_3$ gas within the process chamber 201 is set to fall within a range of, e.g., 0.01 to 3,960 Pa. By setting the internal pressure of the process chamber 201 to fall within such a relatively high pressure zone, it is possible to thermally activate the $NH_3$ gas in a non-plasma manner. If the $NH_3$ gas is supplied by thermally activating the same, it is possible to generate a relatively soft reaction. This makes it possible to relatively softly perform the nitriding which will be described later. The time period for supplying the thermally-activated $NH_3$ gas to the wafer 200, namely the gas supply time (irradiation time), is set to fall within a range of, e.g., 1 to 120 seconds, specifically, 1 to 60 seconds. Other processing conditions may be similar to, e.g., the processing conditions of Step 1.

At this time, the gas flowing into the process chamber 201 is a thermally-activated $NH_3$ gas. The HCDS gas, the $C_3H_6$ gas and the $O_2$ gas do not flow into the process chamber 201.

Accordingly, the NH$_3$ gas does not make a gas phase reaction and is supplied to the wafer 200 in an activated state. The NH$_3$ gas supplied to the wafer 200 reacts with at least a portion of the third layer (SiOC layer) formed on the wafer 200 at Step 3. Thus, the third layer is thermally nitrided in a non-plasma manner and is changed (modified) into a Si-, O-, C- and N-containing fourth layer, namely a silicon oxycarbonitride layer (SiOCN layer). When forming the fourth layer, the impurities such as Cl and the like contained in the third layer make up a gaseous material containing at least Cl in the course of the modifying reaction generated by the NH$_3$ gas. The gaseous material is exhausted from the interior of the process chamber 201. That is to say, the impurities such as Cl and the like contained in the third layer are extracted or desorbed from the third layer and are separated from the third layer. Thus, the fourth layer becomes a layer which is smaller in the amount of the impurities such as Cl and the like than the third layer.

Furthermore, by supplying the activated NH$_3$ gas to the wafer 200, the uppermost surface of the third layer is modified in the course of nitriding of the third layer. The uppermost surface of the third layer subjected to the surface modifying process in the course of nitriding, namely the uppermost surface of the fourth layer, becomes a surface on which HCDS is easily adsorbed and Si is easily deposited at Step 1 performed in the next cycle. That is to say, the NH$_3$ gas used at Step 4 acts as an adsorption/deposition promoting gas which promotes adsorption and deposition of HCDS or Si on the upper surface of the fourth layer (the uppermost surface of the wafer 200).

At this time, the nitriding reaction of the third layer is not saturated. For example, if the third layer having a thickness of several atomic layers is formed at Steps 1 to 3, at least a portion of the surface layer (the one atomic layer of the surface) is nitrided. In this case, in order not to nitride the entire third layer, nitriding is performed under a condition in which the nitriding reaction of the third layer is unsaturated. Depending on the conditions, some layers existing below the surface layer of the third layer may be nitrided. However, from the viewpoint of enhancing the controllability of a composition ratio of a SiOCN film finally formed on the wafer 200, it is advisable to nitride only the surface layer. Furthermore, for example, even if the third layer having a thickness of one atomic layer or less than one atomic layer is formed at Steps 1 to 3, a portion of the surface layer is similarly nitrided. Even in this case, in order not to nitride the entire third layer, nitriding is performed under a condition in which the nitriding reaction of the third layer is unsaturated. In addition, by setting the processing conditions at Step 4 to fall within the range of the aforementioned processing conditions, it is possible to make the nitriding reaction of the third layer unsaturated.

As the nitriding gas, in addition to the NH$_3$ gas, it may be possible to use a hydrogen nitride-based gas such as a diazene (N$_2$H$_2$) gas, a hydrazine (N$_2$H$_4$) gas, an N$_3$H gas or the like, or a gas containing these compounds.

[Step 4p (NH$_3$ Gas Exhaust)]

After the fourth layer is formed, the valve 243b is closed to stop the supply of the NH$_3$ gas. Then, the NH$_3$ gas remaining within the process chamber 201, which has not reacted or which has contributed to the formation of the fourth layer, or the reaction byproduct is exhausted from the interior of the process chamber 201. The processing procedures and the processing conditions used at this time will be described later. As the inert gas, in addition to the N$_2$ gas, it may be possible to use, e.g., various kinds of rare gases illustrated at Step 1p.

(Performing a Predetermined Number of Times)

The cycle which non-simultaneously, i.e., non-synchronously, performs above-described eight steps is performed a predetermined number of times (n times) to thereby form a SiOCN film having a predetermined composition and a predetermined thickness on the wafer 200. The above cycle may be repeated multiple times. That is to say, the thickness of the fourth layer (SiOCN layer) formed when performing the aforementioned cycle once may be set to become smaller than a desired or specified film thickness. The above cycle may be repeated multiple times until the film thickness of the SiOCN film formed by laminating the fourth layers (SiOCN layers) becomes equal to the desired or specified film thickness.

(Purge and Return to Atmospheric Pressure)

After the formation of the SiOCN film is completed, the valves 243c and 243d are opened. The N$_2$ gas is supplied into the process chamber 201 from each of the gas supply pipes 232c and 232d and is exhausted from the exhaust pipe 231. The N$_2$ gas serves as a purge gas. Thus, the interior of the process chamber 201 is purged, and the residual gas or the reaction byproduct remaining within the process chamber 201 is removed from the interior of the process chamber 201 (purge). Thereafter, the internal atmosphere of the process chamber 201 is substituted with an inert gas (inert gas substitution), and the internal pressure of the process chamber 201 is returned to an atmospheric pressure (return to atmospheric pressure).

(Boat Unloading and Wafer Exhaust)

The seal cap 219 is moved down by the boat elevator 115 to open the lower end of the reaction tube 203. The processed wafers 200 supported by the boat 217 are unloaded from the lower end of the reaction tube 203 to the outside of the reaction tube 203 (boat unloading). Thereafter, the processed wafers 200 are exhausted from the boat 217 (wafer exhaust).

(3) Exhaust Steps of O$_2$ Gas and NH$_3$ Gas

In the film forming sequence described above, Steps 1 to 4 are performed non-simultaneously. That is to say, after the residual gas and the like existing within the process chamber 201 are removed by performing Steps 1p to 4p, the precursor gas (the HCDS gas) or the reaction gas (the O$_2$ gas, the NH$_3$ gas, etc.) is supplied into the process chamber 201. By doing so, it is possible to avoid a gas phase reaction of the precursor gas and the reaction gas, for example, a gas phase reaction of the HCDS gas and the O$_2$ gas or a gas phase reaction of the HCDS gas and the NH$_3$ gas, otherwise generated within the process chamber 201. Consequently, it is possible to suppress generation of particles within the process chamber 201.

Furthermore, in the film forming sequence described above, the O$_2$ gas or the NH$_3$ gas is supplied through the nozzle 249b differing from the nozzle 249a through which the HCDS gas is supplied. Furthermore, at Step 1, the infiltration of the HCDS gas into the nozzle 249b is prevented by supplying the N$_2$ gas into the nozzle 249b. Moreover, at Steps 3 and 4, the infiltration of the O$_2$ gas and the NH$_3$ gas into the nozzle 249a is prevented by supplying the N$_2$ gas into the nozzle 249a. By doing so, it is possible to avoid a gas phase reaction of the HCDS gas and the O$_2$ gas or a gas phase reaction of the HCDS gas and the NH$_3$ gas otherwise generated within the nozzles 249a and 249b. Consequently, it is possible to suppress generation of particles within the nozzles 249a and 249b.

According to the extensive studies conducted by the present inventors, it was found that, in the film forming sequence described above, if the processing conditions at Step 3p of exhausting the $O_2$ gas and at Step 4p of exhausting the $NH_3$ gas are similar to the processing conditions at Step 1p of exhausting the HCDS gas and at Step 2p of exhausting the $C_3H_6$ gas, there may be a case where the amount of particles generated within the process chamber 201 increases. More specifically, if the processing procedures or the processing conditions at Steps 3p and 4p are similar to the processing procedures or the processing conditions at Steps 1p and 2p, there may be a case where particles are generated in a large amount within the nozzle 249b when Steps 3 and 4 are performed. Thus, there may be a case where the amount of particles is increased within the process chamber 201, particularly near the nozzle 249b.

According to the extensive studies conducted by the present inventors, it was found that the aforementioned phenomenon is generated by supplying the $O_2$ gas and the $NH_3$ gas in a state in which the $O_2$ gas and the $NH_3$ gas are mixed with the impurities contained in a small amount on the inner surface (inner wall surface) of the nozzle 249b in the course of manufacturing the nozzle 249b, for example, the impurities including a metal element such as iron (Fe), titanium (Ti), aluminum (Al) or the like. Hereinafter, a particle generation mechanism will be described in detail.

If Step 3p of exhausting the $O_2$ gas from the interior of the process chamber 201 is performed after performing Step 3 of supplying the $O_2$ gas into the process chamber 201 through the nozzle 249b, the $O_2$ gas is exhausted not only from the interior of the process chamber 201 but also from the interior of the nozzle 249b. However, depending on the processing procedures or the processing conditions of Step 3p, there may be a case where a small amount of $O_2$ gas adheres to and remains within the nozzle 249b. The $O_2$ gas remaining within the nozzle 249b is mixed with the $NH_3$ gas supplied into the nozzle 249b, at Step 4 performed immediately after Step 3p. If the $O_2$ gas and the $NH_3$ gas are mixed within the nozzle 249b, they react with each other. Thus, there may be a case where active radicals including an OH group are generated. The radicals react with the impurities including a metal element contained on the inner wall surface of the nozzle 249b. Thus, there may be a case where small particles are generated in a large amount.

If Step 4p of exhausting the $NH_3$ gas from the interior of the process chamber 201 is performed after performing Step 4 of supplying the $NH_3$ gas into the process chamber 201 through the nozzle 249b, the $NH_3$ gas is exhausted not only from the interior of the process chamber 201 but also from the interior of the nozzle 249b. However, similar to Step 3p, depending on the processing procedures or the processing conditions of Step 4p, there may be a case where a small amount of $NH_3$ gas adheres to and remains within the nozzle 249b. The $NH_3$ gas remaining within the nozzle 249b is mixed with the $O_2$ gas supplied into the nozzle 249b, at Step 3 performed in the next cycle. If the $NH_3$ gas and the $O_2$ gas are mixed within the nozzle 249b, they react with each other as mentioned above. Thus, there may be a case where active radicals including an OH group are generated. The radicals react with the impurities including a metal element contained on the inner wall surface of the nozzle 249b. Thus, there may be a case where small particles are generated in a large amount.

Accordingly, in the film forming sequence according to the present embodiment, in order to suppress generation of particles attributable to the aforementioned reaction generated within the nozzle 249b, at least one of the gas exhaust effect (e.g., an amount of an exhausted gas) and the gas exhaust efficiency (e.g., an amount of an exhausted gas per time, i.e., exhaust rate) at Steps 3p and 4p is made larger than at least one of the gas exhaust effect and the gas exhaust efficiency at Steps 1p and 2p.

Figure 4:
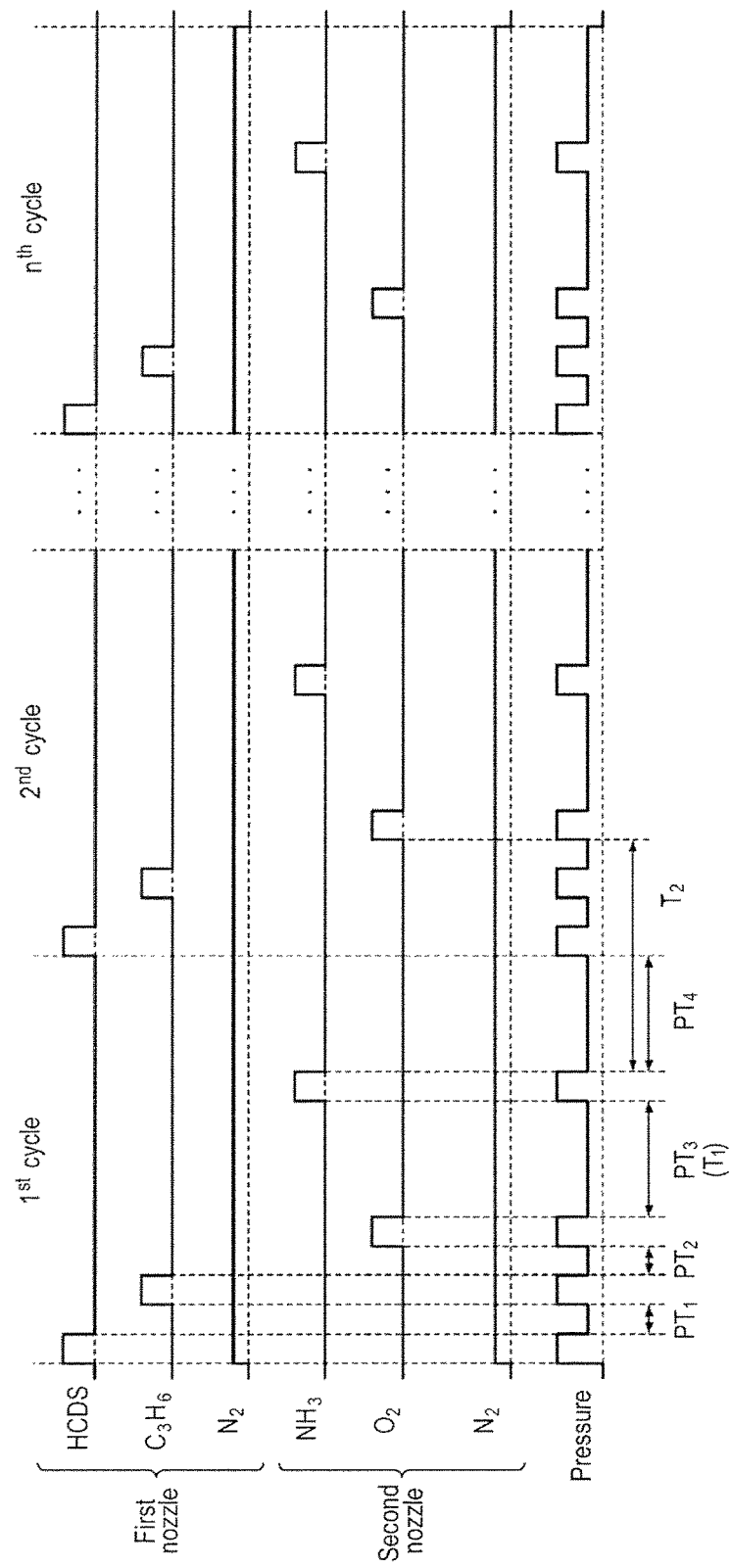
FIG. 4 is a view illustrating gas supply timings and a change of an internal pressure of a process chamber in a film forming sequence according to one embodiment of the present disclosure and illustrating a state in which a purge process time is prolonged at respective steps of exhausting an O-containing gas and a H-containing gas.

For example, in the film forming sequence illustrated in FIG. 4, the gas exhaust times ($PT_3$ and $PT_4$ in FIG. 4) at Step 3p of exhausting the $O_2$ gas and at Step 4p of exhausting the $NH_3$ gas are respectively set longer than the gas exhaust times ($PT_1$ and $PT_2$ in FIG. 4) at Step 1p of exhausting the HCDS gas and at Step 2p of exhausting the $C_3H_6$ gas. That is to say, $PT_3$ is larger than $PT_1$ or $PT_2$ and $PT_4$ is larger than $PT_1$ or $PT_2$. By setting the processing conditions, namely the gas exhaust times, at Steps 3p and 4p in this way, it is possible to make the gas exhaust effect at Step 3p and the gas exhaust effect at Step 4p respectively larger than the gas exhaust effect at Step 1p and respectively larger than the gas exhaust effect at Step 2p.

Figure 5:
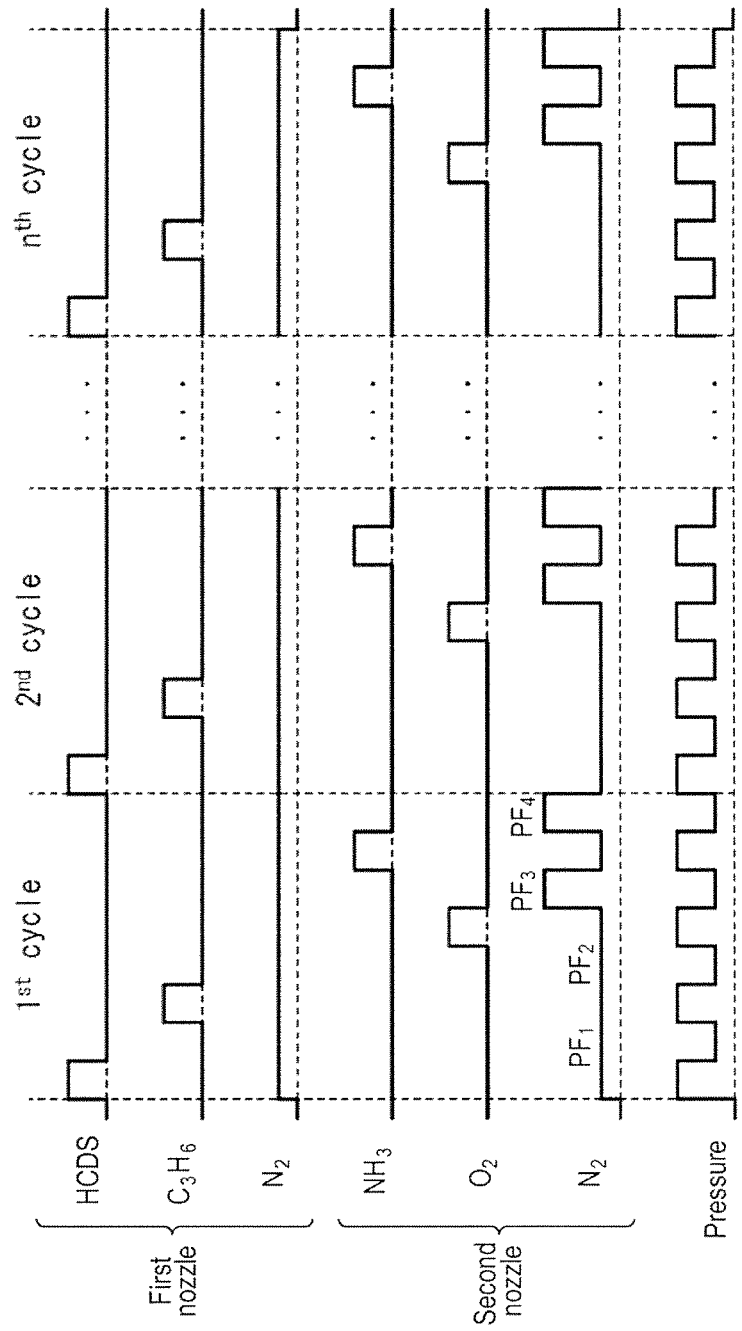
FIG. 5 is a view illustrating gas supply timings and a change of an internal pressure of a process chamber in a film forming sequence according to one embodiment of the present disclosure and illustrating a state in which a supply flow rate of a purge gas is increased at respective steps of exhausting an O-containing gas and a H-containing gas.

Furthermore, for example, in the film forming sequence illustrated in FIG. 5, the supply flow rates ($PF_3$ and $PF_4$ in FIG. 5) of the $N_2$ gas supplied into the process chamber 201 at Step 3p of exhausting the $O_2$ gas and at Step 4p of exhausting the $NH_3$ gas are respectively set larger than the supply flow rates ($PF_1$ and $PF_2$ in FIG. 5) of the $N_2$ gas supplied into the process chamber 201 at Step 1p of exhausting the HCDS gas and at Step 2p of exhausting the $C_3H_6$ gas. That is to say, $PF_3$ is set larger than $PF_1$ or $PF_2$ and $PF_4$ is set larger than $PF_1$ or $PF_2$. By setting the processing conditions, namely the supply flow rates of the $N_2$ gas acting as a purge gas, at Steps 3p and 4p in this way, it is possible to make the gas exhaust efficiency at Step 3p and the gas exhaust efficiency at Step 4p respectively larger than the gas exhaust efficiency at Step 1p and respectively larger than the gas exhaust efficiency at Step 2p. Consequently, it is possible to make the gas exhaust effect at Step 3p and the gas exhaust effect at Step 4p respectively larger than the gas exhaust effect at Step 1p and respectively larger than the gas exhaust effect at Step 2p.

Figure 6:
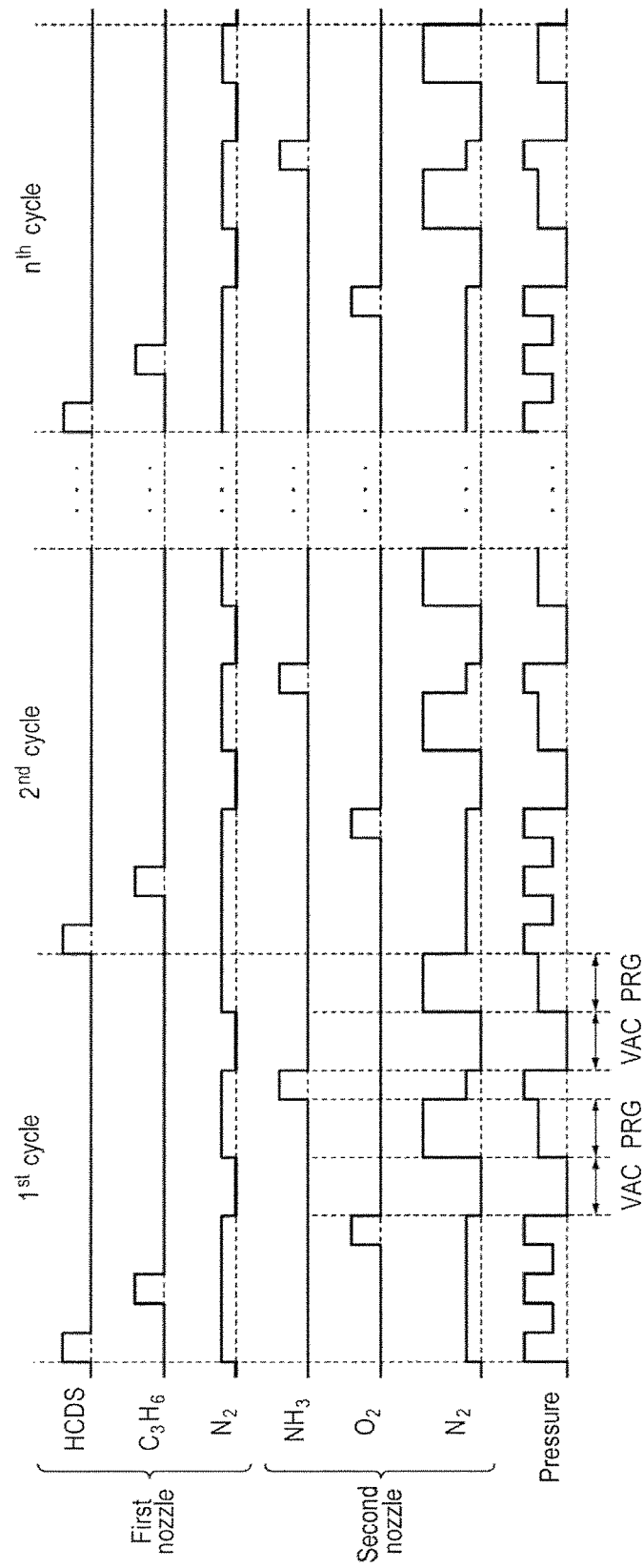
FIG. 6 is a view illustrating gas supply timings and a change of an internal pressure of a process chamber in a film forming sequence according to one embodiment of the present disclosure and illustrating a state in which a vacuum-drawing process and a purge process are sequentially performed at respective steps of exhausting an O-containing gas and a H-containing gas.

Furthermore, for example, in the film forming sequence illustrated in FIG. 6, at Step 3p of exhausting the $O_2$ gas and at Step 4p of exhausting the $NH_3$ gas, an exhaust process (indicated by VAC in FIG. 6) which exhausts (vacuum-exhausts, depressurization-exhausts or vacuum-draws) the interior of the process chamber 201 substantially without supplying a gas into the process chamber 201 and a purge process (indicated by PRG in FIG. 6) which exhausts the interior of the interior of the process chamber 201 while supplying the $N_2$ gas into the process chamber 201 are non-simultaneously, i.e., alternately, performed once. As used herein, the phrase "substantially without supplying a gas into the process chamber 201" may include a case in which a gas such as an inert gas or the like is flowed into the process chamber 201 at a low flow rate (e.g., 100 to 200 sccm) in addition to a case in which no gas is flowed into the process chamber 201. At Step 1p of exhausting the HCDS gas and at Step 2p of exhausting the $C_3H_6$ gas, the aforementioned exhaust process (VAC) is not performed and only the purge process (PRG) which exhausts the interior of the interior of the process chamber 201 while supplying the $N_2$ gas into the process chamber 201 is performed. By setting the processing procedures of Steps 3p and 4p in this way, it is possible to make the gas exhaust efficiency at Step 3p and the gas exhaust efficiency at Step 4p respectively larger than the gas exhaust efficiency at Step 1p and respectively larger than the gas exhaust efficiency at Step 2p. Presumably, this is because a pressure change is generated within the nozzle 249b or the like when alternately performing the exhaust process (VAC) and the purge process (PRG), thereby promoting the exhaust of the reaction gas which adheres to the inner surface of the nozzle 249b and remains within the nozzle 249b. Consequently, it is possible to make the gas exhaust effect at Step 3p and the gas exhaust effect at Step 4p respectively larger than the gas exhaust effect at Step 1p and respectively larger than the gas exhaust effect at Step 2p.

Figure 7:
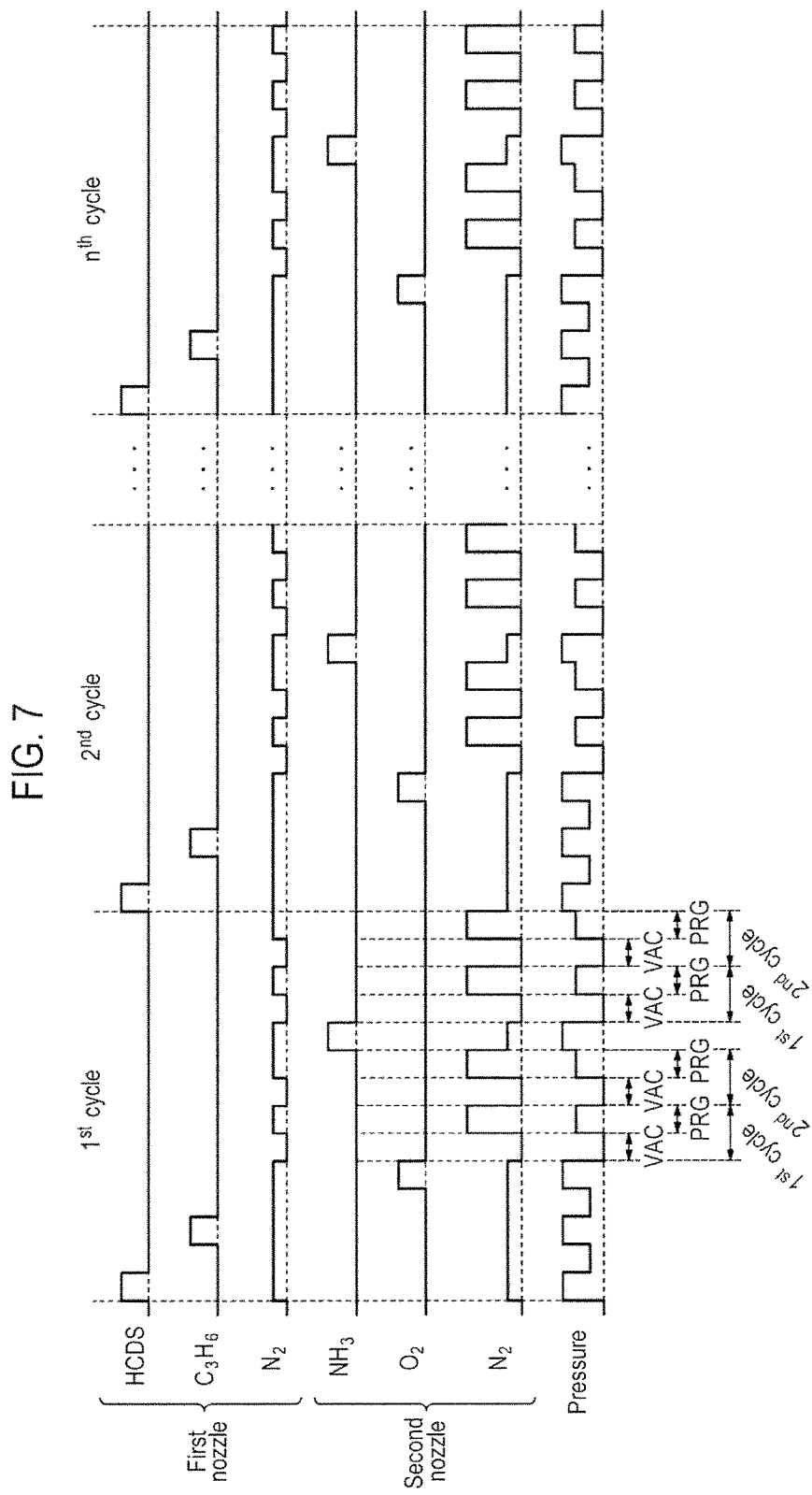
FIG. 7 is a view illustrating gas supply timings in a film forming sequence according to one embodiment of the present disclosure and illustrating a state in which a cycle purge process of alternately repeating a vacuum-drawing process and a purge process is performed at respective steps of exhausting an O-containing gas and a H-containing gas.

Furthermore, for example, in the film forming sequence illustrated in FIG. 7, at Step 3p of exhausting the $O_2$ gas and at Step 4p of exhausting the $NH_3$ gas, there is performed a cycle purge process which non-simultaneously, i.e., alternately, repeats multiple times: an exhaust process (VAC) which exhausts (vacuum-exhausts, depressurization-exhausts or vacuum-draws) the interior of the process chamber 201 substantially without supplying a gas into the process chamber 201 and; a purge process (PRG) which exhausts the interior of the interior of the process chamber 201 while supplying the $N_2$ gas into the process chamber 201. FIG. 7 illustrates an example where the number of repetition times of the cycle purge process performed at Steps 3p and 4p is twice. At Step 1p of exhausting the HCDS gas and at Step 2p of exhausting the $C_3H_6$ gas, the aforementioned exhaust process (VAC) is not performed and only the purge process (PRG) which exhausts the interior of the interior of the process chamber 201 while supplying the $N_2$ gas into the process chamber 201 is performed. By setting the processing procedures of Steps 3p and 4p in this way, it is possible to make the gas exhaust efficiency at Step 3p and the gas exhaust efficiency at Step 4p respectively larger than the gas exhaust efficiency at Step 1p and respectively larger than the gas exhaust efficiency at Step 2p. Presumably, this is because a pressure change is repeatedly generated within the nozzle 249b or the like when alternately repeating the exhaust process and the purge process, thereby promoting the exhaust of the reaction gas which adheres to the inner surface of the nozzle 249b and remains within the nozzle 249b. Consequently, it is possible to make the gas exhaust effect at Step 3p and the gas exhaust effect at Step 4p respectively larger than the gas exhaust effect at Step 1p and respectively larger than the gas exhaust effect at Step 2p.

If the gas exhaust times ($PT_3$ and $PT_4$) at Steps 3p and 4p are equal in length to each other, the purge time (indicated by $T_1$ in FIG. 4) required in purging the interior of the nozzle 249b between Steps 3 and 4 becomes shorter than the purge time (indicated by $T_2$ in FIG. 4) required in purging the interior of the nozzle 249b between Steps 4 and 3. That is to say, the time ($T_1$) taken until the supply of the $NH_3$ gas into the process chamber 201 is started after stopping the supply of the $O_2$ gas into the process chamber 201 becomes shorter than the time ($T_2$) taken until the supply of the $O_2$ gas into the process chamber 201 is started after stopping the supply of the $NH_3$ gas into the process chamber 201 ($T_1<T_2$). For that reason, there is a tendency that the amount ($R_4$) of the reaction gas ($O_2$ gas) remaining within the nozzle 249b immediately prior to starting Step 4 becomes larger than the amount ($R_3$) of the reaction gas ($NH_3$ gas) remaining within the nozzle 249b immediately prior to starting Step 3 ($R_4>R_3$). The present inventors have confirmed that, if the processing procedures or the processing conditions at Step 3p are similar to the processing procedures or the processing conditions at Step 4p, there may be a case where the amount ($D_4$) of particles generated within the process chamber 201 at Step 4 becomes larger than the amount ($D_3$) of particles generated within the process chamber 201 at Step 3 ($D_4>D_3$).

Accordingly, in order to reliably suppress generation of particles within the nozzle 249b, at least one of the gas exhaust effect and the gas exhaust efficiency at Step 3p may be made larger than at least one of the gas exhaust effect and the gas exhaust efficiency at Step 4p.

For example, in the film forming sequence illustrated in FIG. 4, the gas exhaust time ($PT_3$) at Step 3p of exhausting the $O_2$ gas may be made longer than the gas exhaust time ($PT_4$) at Step 4p of exhausting the $NH_3$ gas. For example, if the gas exhaust times ($PT_1$ and $PT_2$) at Steps 1p and 2p are respectively set at 10 seconds, the gas exhaust time ($PT_3$) at Step 3p may be 60 seconds and the gas exhaust time ($PT_4$) at Step 4p may be 50 seconds. As an alternative example, in this case, the gas exhaust time ($PT_3$) at Step 3p may be 50 seconds and the gas exhaust time ($PT_4$) at Step 4p may be 40 seconds. As a further alternative example, in this case, the gas exhaust time ($PT_3$) at Step 3p may be 40 seconds and the gas exhaust time ($PT_4$) at Step 4p may be 30 seconds. By setting the processing conditions of Steps 3p and 4p in this way, it is possible to make the gas exhaust effect at Step 3p larger than the gas exhaust effect at Step 4p.

Furthermore, for example, in the film forming sequence illustrated in FIG. 5, the supply flow rate ($PF_3$) of the $N_2$ gas supplied into the process chamber 201 at Step 3p of exhausting the $O_2$ gas may be made larger than the supply flow rate ($PF_4$) of the $N_2$ gas supplied into the process chamber 201 at Step 4p of exhausting the $NH_3$ gas. For example, if the supply flow rates ($PF_1$ and $PF_2$) of the $N_2$ gas at Steps 1p and 2p are respectively set at 2 slm, the supply flow rate ($PF_3$) of the $N_2$ gas at Step 3p may be 20 slm and the supply flow rate ($PF_4$) of the $N_2$ gas at Step 4p may be 15 slm. As an alternative example, in this case, the supply flow rate ($PF_3$) of the $N_2$ gas at Step 3p may be 15 slm and the supply flow rate ($PF_4$) of the $N_2$ gas at Step 4p may be 10 slm. As a further alternative example, in this case, the supply flow rate ($PF_3$) of the $N_2$ gas at Step 3p may be 10 slm and the supply flow rate ($PF_4$) of the $N_2$ gas at Step 4p may be 8 slm. By setting the processing conditions of Steps 3p and 4p in this way, it is possible to make the gas exhaust efficiency at Step 3p larger than the gas exhaust efficiency at Step 4p. Consequently, it is possible to make the gas exhaust effect at Step 3p larger than the gas exhaust effect at Step 4p.

Furthermore, for example, in the film forming sequence illustrated in FIG. 7, the number of performance times $m_3$ of the cycle purge process performed at Step 3p of exhausting the $O_2$ gas may be made larger than the number of performance times $m_4$ of the cycle purge process performed at Step 4p of exhausting the $NH_3$ gas. For example, if only the purge process (PRG) is performed at Steps 1p and 2p, the number of performance times $m_3$ at Step 3p may be twice and the number of performance times $m_4$ at Step 4p may be once. As an alternative example, the number of performance times $m_3$ at Step 3p may be three times and the number of performance times $m_4$ at Step 4p may be twice. As a further alternative example, the number of performance times $m_3$ at Step 3p may be four times and the number of performance times $m_4$ at Step 4p may be three times. By setting the processing conditions of Steps 3p and 4p, namely the number of performance times of the cycle purge, in this way, it is possible to make the gas exhaust efficiency at Step 3p larger than the gas exhaust efficiency at Step 4p. Consequently, it is possible to make the gas exhaust effect at Step 3p larger than the gas exhaust effect at Step 4p.

Various kinds of methods illustrated in FIGS. 4 to 7, namely various kinds of methods for enhancing the gas exhaust efficiency or the gas exhaust effect at Steps 3p and 4p, may be used either independently or in arbitrary combination.

(4) Effects According to the Present Embodiment

According to the present embodiment, one or more effects may be achieved, as follows.

(a) By making at least one of the gas exhaust effect and the gas exhaust efficiency at Steps 3p and 4p larger than at least one of the gas exhaust effect and the gas exhaust efficiency at Steps 1p and 2p, it is possible to restrain the $O_2$ gas or the $NH_3$ gas from remaining within the nozzle 249b. Consequently, it is possible to suppress the reaction of the $O_2$ gas and the $NH_3$ gas within the nozzle 249b, namely the generation of radicals within the nozzle 249b. This makes it possible to suppress the generation of particles within the nozzle 249b and to reduce the amount of particles within the process chamber 201. As a result, it is possible to improve the quality of the SiOCN film formed on the wafer 200.

(b) By making at least one of the gas exhaust effect and the gas exhaust efficiency at Step 3p larger than at least one of the gas exhaust effect and the gas exhaust efficiency at Step 4p, it is possible to reliably suppress the generation of particles within the nozzle 249b and to further reduce the amount of particles within the process chamber 201. Thus, it is possible to improve the quality of the SiOCN film formed on the wafer 200.

(c) At Steps 3 and 4, the $O_2$ gas or the $NH_3$ gas is supplied through the nozzle 249b differing from the nozzle 249a through which the HCDS gas is supplied. Furthermore, at Step 1, the infiltration of the HCDS gas into the nozzle 249b is prevented. Moreover, at Steps 3 and 4, the infiltration of the $O_2$ gas or the $NH_3$ gas into the nozzle 249a is prevented. This makes it possible to avoid generation of an unnecessary gas phase reaction within the nozzles 249a and 249b and to suppress generation of particles within the nozzles 249a and 249b.

(d) Steps 1 to 4 are performed non-simultaneously, i.e., without synchronizing the supply timings of the precursor gas and the various kinds of reaction gases. This enables the gases to moderately contribute to the reactions under a condition in which a gas phase reaction or a surface reaction is moderately generated. Consequently, it is possible to avoid an excessive gas phase reaction otherwise generated within the process chamber 201. This makes it possible to suppress the generation of particles. It is also possible to improve the step coverage and the film thickness controllability of the SiOCN film formed on the wafer 200.

(e) By applying the aforementioned various kinds of methods for enhancing the exhaust efficiency and exhaust effect of the reaction gases to only Steps 3p and 4p and not to Steps 1p and 2p, it is possible to suppress a reduction in the productivity of the film forming process and to suppress an increase in the film forming cost.

If the gas exhaust times ($PT_1$ and $PT_2$) at Steps 1p and 2p are prolonged to become substantially equal to the times ($PT_3$ and $PT_4$) required in exhausting the $O_2$ gas and the $NH_3$ gas from the interior of the nozzle 249b at Steps 3p and 4p, there may be a case where the time (cycle time) required per one cycle becomes longer, thereby reducing the productivity of the film forming process. Even when the processing procedures (the cycle purge process) similar to those of Steps 3p and 4p of the film forming sequences illustrated in FIGS. 6 and 7 are applied to Steps 1p and 2p, there may be a case where the cycle time is increased and the productivity of the film forming process is reduced. Furthermore, the supply flow rates ($PF_1$ and $PF_2$) of the $N_2$ gas supplied into the process chamber 201 at Steps 1p and 2p are increased to become substantially equal to the supply flow rates ($PF_3$ and $PF_4$) of the $N_2$ gas required in exhausting the $O_2$ gas and the $NH_3$ gas from the interior of the nozzle 249b at Steps 3p and 4p, there may be a case where the amount of the $N_2$ gas consumed per one cycle is increased, thereby increasing the film forming cost.

In contrast, in the film forming sequence of the present embodiment, the aforementioned various kinds of methods for enhancing the exhaust efficiency and exhaust effect of the reaction gases are applied to only Steps 3p and 4p. It is therefore possible to suppress a reduction in the productivity of the film forming process and to suppress an increase in the film forming cost.

(f) In the film forming sequences illustrated in FIGS. 6 and 7, at least one of Step 3p of exhausting the $O_2$ gas and Step of exhausting the $NH_3$ gas, the performance time of the purge process (PRG) which exhausts the interior of the process chamber 201 while supplying the $N_2$ gas into the process chamber 201 may be made shorter than the performance time of the exhaust process (VAC) which exhausts the interior of the process chamber 201 substantially without supplying a gas into the process chamber 201. For example, at Steps 3p and 4p, the performance time of the exhaust process (VAC) may be 60 seconds and the performance time of the purge process (PRG) may be 30 seconds. Furthermore, at Steps 3p and 4p, the performance time of the exhaust process (VAC) may be 30 seconds and the performance time of the purge process (PRG) may be 15 seconds. In this case, it is possible to shorten the time required at Steps 3p and 4p while maintaining the exhaust efficiency and exhaust effect of the reaction gases (the $O_2$ gas and the $NH_3$ gas) within the nozzle 249b. Consequently, it is possible to shorten the cycle time and to enhance the productivity of the film forming process. In addition, it is possible to reduce the amount of the $N_2$ gas consumed per one cycle, thereby reducing the film forming cost.

(g) The aforementioned effects are equally achievable even when a gas other than the HCDS gas is used as the precursor gas, a gas other than the $C_3H_6$ gas is used as the C-containing gas, a gas other than the $O_2$ gas is used as the O-containing gas, and a gas other than the $NH_3$ gas is used as the H-containing gas.

(5) Modifications

The film forming sequence according to the present embodiment is not limited to the form illustrated in FIGS. 4 to 7 and may be modified as in the modifications to be described below.

(Modifications 1 to 7)

Figure 8:
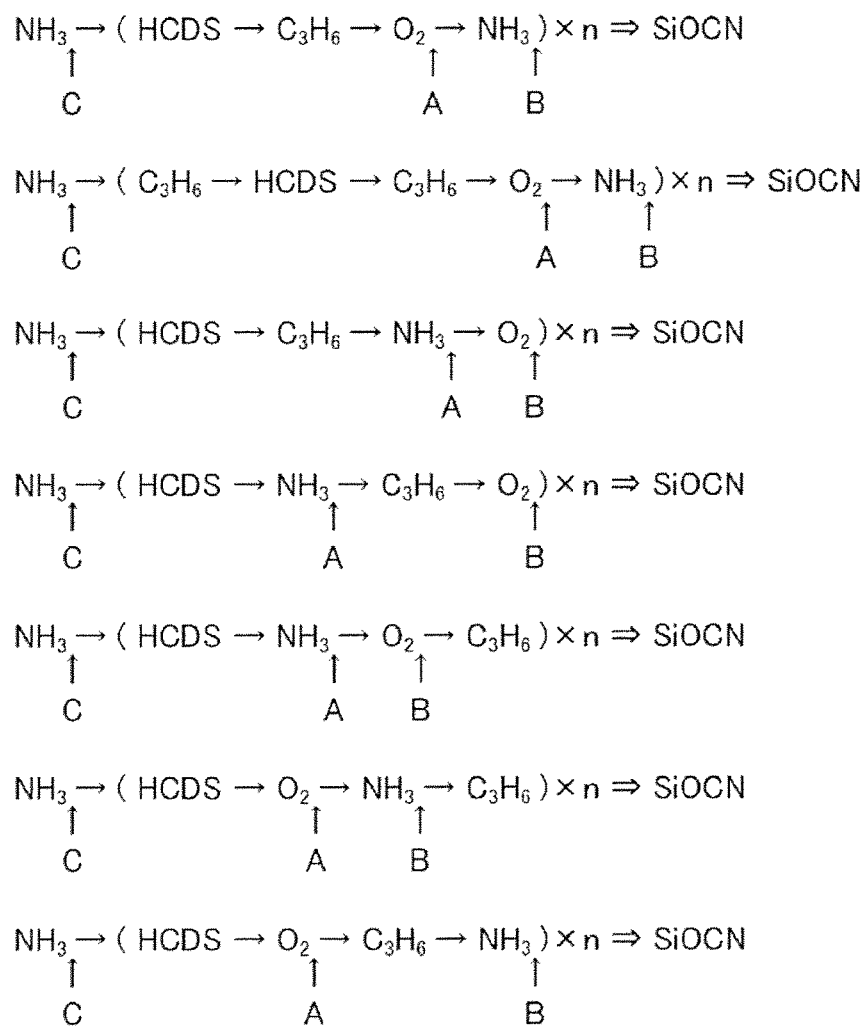
FIG. 8 is a view illustrating modifications 1 to 7 of the film forming sequence according to one embodiment of the present disclosure.

A SiOCN film may be formed on the wafer 200 by each of the film forming sequences illustrated in FIG. 8 (Modifications 1 to 7 in order from the top).

In Modification 1, an $NH_3$ gas as a H-containing gas is first supplied to the wafer 200, thereby performing a surface processing step of pre-processing (modifying) the surface of the wafer 200. Then, a film forming sequence similar to the film forming sequences illustrated in FIGS. 4 to 7 is performed to thereby form a SiOCN film on the surface-processed wafer 200. After the surface processing step is completed, a step of exhausting the $NH_3$ gas from the interior of the process chamber 201 is performed. At this time, if the $NH_3$ gas remains within the nozzle 249b, there may be a case where particles are generated within the nozzle 249b at a later-performed step of supplying an $O_2$ gas. For that reason, at the step of exhausting the $NH_3$ gas, which is performed after the completion of the surface processing step, the $NH_3$ gas is exhausted from the interior of the process chamber 201, for example, under the processing procedures and the processing conditions similar to those of Step 4p of the film forming sequences illustrated in FIGS. 4 to 7. That is to say, at a timing of C indicated in Modification 1, the NH$_3$ gas is exhausted from the interior of the process chamber 201 under the processing procedures and the processing conditions similar to those of the step of exhausting the NH$_3$ gas, which is performed at a timing of B. Furthermore, at a timing of A indicated in Modification 1, the O$_2$ gas is exhausted from the interior of the process chamber 201 under the processing procedures and the processing conditions similar to those of Step 3p of the film forming sequences illustrated in FIGS. 4 to 7.

In Modifications 2 to 7, the supply order and the number of supply times of the HCDS gas, the C$_3$H$_6$ gas, the O$_2$ gas and the NH$_3$ gas differ from those of the film forming sequence indicated in Modification 1. Even in these modifications, if the NH$_3$ gas or the O$_2$ gas remains within the nozzle 249b after the supply of the NH$_3$ gas or the O$_2$ gas, there may be a case where particles are generated within the nozzle 249b at the subsequently-perform step of supplying the O$_2$ gas or the NH$_3$ gas. For that reason, at timings of A to C indicated in Modifications 2 to 7, the NH$_3$ gas or the O$_2$ gas is exhausted from the interior of the process chamber 201 under the processing procedures and the processing conditions similar to those of the reaction gas exhaust steps respectively performed at the timings of A to C indicated in Modification 1. In Modifications 2 to 7, the surface processing step may not be performed.

Even in these modifications, it is possible to achieve the effects similar to those of the film forming sequences illustrated in FIGS. 4 to 7. Furthermore, the uppermost surface of the pre-processed wafer 200 becomes a surface on which HCDS is easily adsorbed and Si is easily deposited. It is therefore possible to efficiently perform the film forming process. In addition, it is possible to enhance the step coverage and the in-plane film thickness uniformity of the film formed on the wafer 200.

Furthermore, in Modifications 1, 2 and 6, similar to the film forming sequences illustrated in FIGS. 4 to 7, at least the step of supplying the O$_2$ gas, the step of exhausting the O$_2$ gas, the step of supplying the NH$_3$ gas and the step of exhausting the NH$_3$ gas are successively performed in the named order. That is to say, the step of supplying the NH$_3$ gas to the wafer 200 is performed immediately after the step of exhausting the O$_2$ gas, which is performed at the timing of A. For that reason, in these modifications, at least one of the gas exhaust effect and the gas exhaust efficiency at the step of exhausting the O$_2$ gas, which is performed at the timing of A, may be made larger than at least one of the gas exhaust effect and the gas exhaust efficiency at the step of exhausting the NH$_3$ gas, which is performed at the timing of B. For example, the gas exhaust time at the step of exhausting the O$_2$ gas may be made longer than the gas exhaust time at the step of exhausting the NH$_3$ gas. Alternatively, the supply flow rate of the N$_2$ gas supplied into the process chamber 201 at the step of exhausting the O$_2$ gas may be made larger than the supply flow rate of the N$_2$ gas at the step of exhausting the NH$_3$ gas. In addition, the number of performance times of the cycle purge performed at the step of exhausting the O$_2$ gas may be made larger than the number of performance times of the cycle purge performed at the step of exhausting the NH$_3$ gas.

In Modifications 3 and 5, at least the step of supplying the NH$_3$ gas, the step of exhausting the NH$_3$ gas, the step of supplying the O$_2$ gas and the step of exhausting the O$_2$ gas are successively performed in the named order. That is to say, the step of supplying the O$_2$ gas to the wafer 200 is performed immediately after the step of exhausting the NH$_3$ gas, which is performed at the timing of A. For that reason, in these modifications, at least one of the gas exhaust effect and the gas exhaust efficiency at the step of exhausting the NH$_3$ gas, which is performed at the timing of A, may be made larger than at least one of the gas exhaust effect and the gas exhaust efficiency at the step of exhausting the O$_2$ gas, which is performed at the timing of B. For example, the gas exhaust time at the step of exhausting the NH$_3$ gas may be made longer than the gas exhaust time at the step of exhausting the O$_2$ gas. Alternatively, the supply flow rate of the N$_2$ gas supplied into the process chamber 201 at the step of exhausting the NH$_3$ gas may be made larger than the supply flow rate of the N$_2$ gas at the step of exhausting the O$_2$ gas. In addition, the number of performance times of the cycle purge performed at the step of exhausting the NH$_3$ gas may be made larger than the number of performance times of the cycle purge performed at the step of exhausting the O$_2$ gas.

Furthermore, in Modifications 4 and 7, the step of supplying the HCDS gas or the C$_3$H$_6$ gas is interposed between the step of supplying the NH$_3$ gas and the step of supplying the O$_2$ gas. For that reason, in these modifications, at least one of the gas exhaust effect and the gas exhaust efficiency at the step of exhausting the reaction gas, which is performed at the timing of A, may be made equal to at least one of the gas exhaust effect and the gas exhaust efficiency at the step of exhausting the reaction gas, which is performed at the timing of B.

Furthermore, in Modifications 1 to 7, the step of supplying the HCDS gas or the C$_3$H$_6$ gas to the wafer 200 is performed until the O$_2$ gas (or the NH$_3$ gas) is initially supplied to the wafer 200 in the first cycle after performing the surface processing step. For that reason, in Modifications 1, 2, 3, 5 and 6, at least one of the gas exhaust effect and the gas exhaust efficiency at the step of exhausting the NH$_3$ gas, which is performed at the timing of C, may be made smaller than at least one of the gas exhaust effect and the gas exhaust efficiency at the step of exhausting the reaction gas, which is performed at the timing of A. Furthermore, in Modifications 1, 2, 3 and 5, at least one of the gas exhaust effect and the gas exhaust efficiency at the step of exhausting the NH$_3$ gas, which is performed at the timing of C, may be made equal to at least one of the gas exhaust effect and the gas exhaust efficiency at the step of exhausting the reaction gas, which is performed at the timing of B. Moreover, in Modifications 4 and 7, at least one of the gas exhaust effect and the gas exhaust efficiency at the step of exhausting the NH$_3$ gas, which is performed at the timing of C, may be made equal to at least one of the gas exhaust effect and the gas exhaust efficiency at the step of exhausting the reaction gas, which is performed at the timing of A or B.

(Modifications 8 to 10)

A SiOCN film or a silicon oxycarbide film (SiOC film) may be formed on the wafer 200 by each of the film forming sequences illustrated in FIG. 9 (Modifications 8 to 10 in order from the top). Even in these modifications, if a TEA gas or an O$_2$ gas remains within the nozzle 249b after stopping the supply of the TEA gas or the O$_2$ gas, there may be a case where particles are generated within the nozzle 249b at the subsequently-performed step of supplying the TEA gas or the O$_2$ gas. For that reason, at timings of A and B indicated in Modifications 8 to 10, the TEA gas or the O$_2$ gas is exhausted from the interior of the process chamber 201 under the processing procedures and the processing conditions similar to those of Steps 3p and 4p of the film forming sequences illustrated in FIGS. 4 to 7. Even in these modifications, it is possible to achieve the effects similar to those of the film forming sequences illustrated in FIGS. 4 to 7. Furthermore, in Modifications 8 to 10, in order to increase the oxidizing power of the $O_2$ gas, the $O_2$ gas may be supplied by plasma-exciting the same. In this case, it becomes easy to form an N-free SiOC film on the wafer 200.

Furthermore, in Modification 8, at least one of the gas exhaust effect and the gas exhaust efficiency at the step of exhausting the TEA gas, which is performed at the timing of A, may be made larger than at least one of the gas exhaust effect and the gas exhaust efficiency at the step of exhausting the $O_2$ gas, which is performed at the timing of B. Moreover, in Modifications 9 and 10, at least one of the gas exhaust effect and the gas exhaust efficiency at the step of exhausting the $O_2$ gas, which is performed at the timing of A, may be made larger than at least one of the gas exhaust effect and the gas exhaust efficiency at the step of exhausting the TEA gas, which is performed at the timing of B. The reasons and the specific methods for obtaining the desired exhaust effect and the like are the same as those described in the film forming sequences illustrated in FIGS. 4 to 7 and in Modifications 1 to 7.

(Modifications 11 to 13)

A silicon oxynitride film (SiON film) may be formed on the wafer 200 by each of the film forming sequences illustrated in FIG. 10 (Modifications 11 to 13 in order from the top). Even in these modifications, if an $NH_3$ gas or an $O_2$ gas remains within the nozzle 249b after stopping the supply of the $NH_3$ gas or the $O_2$ gas, there may be a case where particles are generated within the nozzle 249b at the subsequently-performed step of supplying the $O_2$ gas or the $NH_3$ gas. For that reason, at timings of A and B indicated in Modifications 11 to 13, the $NH_3$ gas or the $O_2$ gas is exhausted from the interior of the process chamber 201 under the processing procedures and the processing conditions similar to those of Steps 3p and 4p of the film forming sequences illustrated in FIGS. 4 to 7. Even in these modifications, it is possible to achieve the effects similar to those of the film forming sequences illustrated in FIGS. 4 to 7.

Furthermore, in Modification 11, at least one of the gas exhaust effect and the gas exhaust efficiency at the step of exhausting the $NH_3$ gas, which is performed at the timing of A, may be made larger than at least one of the gas exhaust effect and the gas exhaust efficiency at the step of exhausting the $O_2$ gas, which is performed at the timing of B. Moreover, in Modifications 12 and 13, at least one of the gas exhaust effect and the gas exhaust efficiency at the step of exhausting the $O_2$ gas, which is performed at the timing of A, may be made larger than at least one of the gas exhaust effect and the gas exhaust efficiency at the step of exhausting the $NH_3$ gas, which is performed at the timing of B. The reasons and the specific methods for obtaining the desired exhaust effect and the like are the same as those described in the film forming sequences illustrated in FIGS. 4 to 7 and in Modifications 1 to 7.

(Modifications 14 to 16)

A silicon oxide film (SiO film) may be formed on the wafer 200 by each of the film forming sequences illustrated in FIG. 11 (Modifications 14 to 16 in order from the top). Even in these modifications, if an $H_2$ gas or an $O_2$ gas remains within the nozzle 249b after stopping the supply of the $H_2$ gas or the $O_2$ gas, there may be a case where particles are generated within the nozzle 249b at the subsequently-performed step of supplying the $O_2$ gas or the $H_2$ gas. For that reason, at timings of A and B indicated in Modifications 14 to 16, the $H_2$ gas or the $O_2$ gas is exhausted from the interior of the process chamber 201 under the processing procedures and the processing conditions similar to those of Steps 3p and 4p of the film forming sequences illustrated in FIGS. 4 to 7. Even in these modifications, it is possible to achieve the effects similar to those of the film forming sequences illustrated in FIGS. 4 to 7. Furthermore, in Modifications 14 to 16, the $H_2$ gas or the $O_2$ gas may be supplied by plasma-exciting the same.

Furthermore, in Modification 14, at least one of the gas exhaust effect and the gas exhaust efficiency at the step of exhausting the $H_2$ gas, which is performed at the timing of A, may be made larger than at least one of the gas exhaust effect and the gas exhaust efficiency at the step of exhausting the $O_2$ gas, which is performed at the timing of B. Moreover, in Modifications 15 and 16, at least one of the gas exhaust effect and the gas exhaust efficiency at the step of exhausting the $O_2$ gas, which is performed at the timing of A, may be made larger than at least one of the gas exhaust effect and the gas exhaust efficiency at the step of exhausting the $H_2$ gas, which is performed at the timing of B. The reasons and the specific methods for obtaining the desired exhaust effect and the like are the same as those described in the film forming sequences illustrated in FIGS. 4 to 7 and in Modifications 1 to 7.

(Processing Condition)

In the modifications described above, at the step of supplying the thermally-activated TEA gas to the wafer 200, the supply flow rate of the TEA gas controlled by the MFC 241b is set to fall within a range of, e.g., 100 to 10,000 sccm. The internal pressure of the process chamber 201 is set to fall within a range of, e.g., 1 to 5,000 Pa, specifically 1 to 4,000 Pa. Furthermore, the partial pressure of the TEA gas within the process chamber 201 is set to fall within a range of, e.g., 0.01 to 4,950 Pa. The time period for supplying the TEA gas to the wafer 200, namely the gas supply time (irradiation time), is set to fall within a range of, e.g., 1 to 200 seconds, specifically 1 to 120 seconds, more specifically 1 to 60 seconds. Other processing conditions may be similar to, e.g., the processing conditions of Step 4 of the film forming sequences illustrated in FIGS. 4 to 7. As the N- C- and H-containing gas, in addition to the TEA gas, it may be possible to use, e.g., an ethylamine-based gas such as a diethylamine (($C_2H_5$)$_2$NH, abbreviation: DEA) gas, a monoethylamine ($C_2H_5NH_2$, abbreviation: MEA) gas or the like, and a methylamine-based gas such as a trimethylamine (($CH_3$)$_3$N, abbreviation: TMA) gas, a dimethylamine (($CH_3$)$_2$NH, abbreviation: DMA) gas, a monomethylamine ($CH_3NH_2$, abbreviation: MMA) gas or the like.

The processing procedures and the processing conditions at other steps may be similar to, e.g., the processing procedures and the processing conditions of the respective steps of the film forming sequences illustrated in FIGS. 4 to 7.

Other Embodiments of the Present Disclosure

While one embodiment of the present disclosure has been specifically described above, the present disclosure is not limited to the aforementioned embodiment but may be differently modified without departing from the spirit of the present disclosure.

For example, in the aforementioned embodiment, there has been mainly described an example where the reaction gas (the C-containing gas, the O-containing gas or the H-containing gas) is supplied after the supply of the precursor gas. The present disclosure is not limited thereto. The supply order of the precursor gas and the reaction gas may be reversed. That is to say, as in Modifications 2, 10, 13 and 16, the precursor gas may be supplied after the supply of the reaction gas. By changing the supply order, it is possible to change the quality or the composition ratio of the thin film thus formed. Furthermore, the supply order of plural kinds of reaction gases may be arbitrarily changed. By changing the supply order of the reaction gases, it is possible to change the quality or the composition ratio of the thin film thus formed. Moreover, the plural kinds of reaction gases may be simultaneously supplied by arbitrarily combining them. That is to say, the plural kinds of reaction gases may be used by mixing them in arbitrary combinations. By doing so, it is possible to change the quality or the composition ratio of the thin film thus formed.

Furthermore, for example, in the aforementioned embodiment, there has been described an example where the O-containing gas ($O_2$ gas) and the H-containing gas ($NH_3$ gas) are supplied into the process chamber 201 through the same nozzle 249b. The present disclosure is not limited thereto. The O-containing gas and the H-containing gas may be supplied into the process chamber 201 through different nozzles. For example, a nozzle (hereinafter often referred to as a third nozzle) differing from the nozzles 249a and 249b may be newly installed within the process chamber 201. At Step 3, the $O_2$ gas may be supplied through the nozzle 249b. At Step 4, the $NH_3$ gas may be supplied through the third nozzle.

A small amount of the $O_2$ gas supplied into the process chamber 201 at Step 3 may sometimes infiltrate into the third nozzle. Furthermore, a small amount of the $NH_3$ gas supplied into the process chamber 201 at Step 4 may sometimes infiltrate into the nozzle 249b. In these cases, the $O_2$ gas and the $NH_3$ gas may react with each other within the third nozzle or the nozzle 249b. Thus, there may be a case where a large amount of fine particles are generated within the third nozzle or the nozzle 249b. The present inventors have confirmed that, even when the $O_2$ gas and the $NH_3$ gas are respectively supplied through different nozzles, if the processing conditions at Steps 3p and 4p are similar to the processing conditions at Steps 1p and 2p, there may be a case where the amount of particles is increase within the process chamber 201, particularly near the third nozzle or the nozzle 249b.

Accordingly, even when the $O_2$ gas and the $NH_3$ gas are respectively supplied through different nozzles, similar to the aforementioned embodiment, at least one of the gas exhaust effect and the gas exhaust efficiency at Steps 3p and 4p is made larger than at least one of the gas exhaust effect and the gas exhaust efficiency at Steps 1p and 2p. This makes it possible to suppress the generation of particles within the nozzle 249b or the third nozzle. That is to say, not only in the case where the $O_2$ gas and the $NH_3$ gas are supplied through the same nozzle but also in the case where the $O_2$ gas and the $NH_3$ gas are respectively supplied through different nozzles, the gas exhaust effect and the gas exhaust efficiency at Steps 3p and 4p are set as described above, and the $O_2$ gas and the $NH_3$ gas are prevented from being mixed within the same nozzle, namely within the same space (kept unmixed). This makes it possible to suppress the generation of particles within the nozzle. However, in the aforementioned embodiment in which the $O_2$ gas and the $NH_3$ gas are supplied through the same nozzle, the probability of reaction of the $O_2$ gas and the $NH_3$ gas within the nozzle becomes higher than when the $O_2$ gas and the $NH_3$ gas are supplied through different nozzles. Thus, particles are easy to generate. For that reason, the technical significance of setting the gas exhaust effect and the gas exhaust efficiency at Steps 3p and 4p as mentioned above becomes larger when the $O_2$ gas and the $NH_3$ gas are supplied through the same nozzle than when the $O_2$ gas and the $NH_3$ gas are supplied through different nozzles.

Furthermore, for example, in the aforementioned embodiment, there has been described an example where the O-containing gas ($O_2$ gas) and the H-containing gas ($NH_3$ gas) are horizontally supplied from the lateral side of the wafer arrangement region through the L-shaped long nozzle (the nozzle 249b) installed at the lateral side of the wafer arrangement region. The present disclosure is not limited to this form. The O-containing gas and the H-containing gas may be supplied from the upper side of the wafer arrangement region toward the lower side thereof or from the lower side of the wafer arrangement region toward the upper side thereof through a short nozzle installed at the upper side or the lower side of the wafer arrangement region. That is to say, instead of the long nozzle installed at the lateral side of the wafer arrangement region, a short nozzle installed at the upper side or the lower side of the wafer arrangement region and provided with gas supply holes at the upper side or the lower side of the wafer arrangement region may be used as the nozzle for supplying the O-containing gas and the H-containing gas.

Even in this case, if the processing conditions at Steps 3p and 4p are similar to the processing conditions at Steps 1p and 2p, the $NH_3$ gas or the $O_2$ gas supplied into the process chamber 201 may not be sufficiently exhausted until Step 3 or 4 is started. Thus, there may be a case where the $NH_3$ gas or the $O_2$ gas adheres to the interior of the process chamber 201 and remains within the process chamber 201. If Step 3 or 4 is started in this state, the $O_2$ gas and the $NH_3$ gas may react with each other within the process chamber 201. Radicals generated by this reaction may react with the impurities including a metal element such as Fe, Ti, Al or the like contained in a small amount on the inner surface of the reaction tube 203 (the inner wall of the process chamber 201). Thus, there may be a case where fine particles are generated in a large amount. Similar to the nozzle 249b, there may be a case where a small amount of impurities including the aforementioned metal element adhere to or are mixed into the inner surface (the surface of the inner wall) of the reaction tube 203 made of quartz or the like, in the course of manufacturing the reaction tube 203. Thus, the aforementioned impurities are contained on the inner surface of the reaction tube 203. In addition, the aforementioned radicals may react with the upper surface of the seal cap 219 made of metal such as stainless steel or the like. Thus, fine particles may be generated in a large amount.

Accordingly, even in the case where the $O_2$ gas and the $NH_3$ gas are supplied through the short nozzle, similar to the aforementioned embodiment, at least one of the gas exhaust effect and the gas exhaust efficiency at Steps 3p and 4p is made larger than at least one of the gas exhaust effect and the gas exhaust efficiency at Steps 1p and 2p. This makes it possible to suppress the generation of particles within the process chamber 201. That is to say, even in the case where the $O_2$ gas and the $NH_3$ gas are supplied through the short nozzle, the gas exhaust effect and the gas exhaust efficiency at Steps 3p and 4p are set as described above, and the $O_2$ gas and the $NH_3$ gas are prevented from being mixed within the process chamber 201, namely within the same space (kept unmixed). This makes it possible to suppress the generation of particles within the process chamber 201. However, in the aforementioned embodiment in which the $O_2$ gas and the $NH_3$ gas are supplied through the long nozzle, the probability of reaction of the $O_2$ gas and the $NH_3$ gas becomes higher than when the $O_2$ gas and the $NH_3$ gas are supplied through the short nozzle. Thus, particles are easy to generate. For that reason, the technical significance of setting the gas exhaust effect and the gas exhaust efficiency at Steps 3p and 4p as mentioned above becomes larger when the $O_2$ gas and the $NH_3$ gas are supplied through the long nozzle than when the $O_2$ gas and the $NH_3$ gas are supplied through the short nozzle.

If the silicon-based insulation film formed by the methods of the film forming sequences illustrated in FIGS. 4 to 7 or the respective modifications described above is used as a sidewall spacer, it is possible to provide a technique of forming a device which is small in leak current and superior in workability. Furthermore, if the aforementioned silicon-based insulation film is used as an etching stopper, it is possible to provide a technique of forming a device which is superior in workability. According to the film forming sequences illustrated in FIGS. 4 to 7 or some of the modifications described above, it is possible to form a silicon-based insulation film having an ideal stoichiometric ratio without having to use plasma. Since the silicon-based insulation film can be formed without having to use plasma, it is possible to adapt the present disclosure to a process for forming, e.g., a SADP film of a DPT, in which plasma damage is about a concern.

The aforementioned film forming sequences may be suitably applied to a case where an oxide film containing a metal element such as titanium (Ti), zirconium (Zr), hafnium (Hf), tantalum (Ta), niobium (Nb), aluminum (Al), molybdenum (Mo), tungsten (W) or the like, namely a metal-based oxide film, is formed on the wafer 200. That is to say, the aforementioned film forming sequences may be suitably applied to a case where a TiOCN film, a TiOC film, a TiON film, a TiO film, a ZrOCN film, a ZrOC film, a ZrON film, a ZrO film, an HfOCN film, an HfOC film, an HfON film, an HfO film, a TaOCN film, a TaOC film, a TaON film, a TaO film, an NbOCN film, an NbOC film, an NbON film, an NbO film, an AlOCN film, an AlOC film, an AlON film, an AlO film, an MoOCN film, an MoOC film, an MoON film, an MoO film, a WOCN film, a WOC film, a WON film, or a WO film is formed on the wafer 200.

In the case of forming the metal-based oxide film, as the precursor gas, it may be possible to use, e.g., an inorganic metal precursor gas containing a metal element and a halogen element, such as a titanium tetrachloride ($TiCl_4$) gas, a titanium tetrafluoride ($TiF_4$) gas, a zirconium tetrachloride ($ZrCl_4$) gas, a zirconium tetrafluoride ($ZrF_4$) gas, a hafnium tetrachloride ($HfCl_4$) gas, a hafnium tetrafluoride ($HfF_4$) gas, a tantalum pentachloride ($TaCl_5$) gas, a tantalum pentafluoride ($TaF_5$) gas, a niobium pentachloride ($NbCl_5$) gas, a niobium pentafluoride ($NbF_5$) gas, an aluminum trichloride ($AlCl_3$) gas, an aluminum trifluoride ($AlF_3$) gas, a molybdenum pentachloride ($MoCl_5$) gas, a molybdenum pentafluoride ($MoF_5$) gas, a tungsten hexachloride ($WCl_6$) gas, a tungsten hexafluoride ($WF_6$) gas, or the like. Furthermore, as the precursor gas, it may be possible to use, e.g., an organic metal precursor gas containing a metal element and carbon, such as a trimethyl aluminum ($Al(CH_3)_3$, abbreviation: TMA) gas or the like. As the reaction gases, it may be possible to use gases similar to those used in the aforementioned embodiment.

For example, a TiON film or a TiO film may be formed on the wafer 200 by the film forming sequences illustrated in FIG. 12 (film forming sequence examples 1 to 3 in order from the top). The processing procedures and the processing conditions at the respective steps of the film forming sequences may be similar to, e.g., the processing procedures and the processing conditions of the aforementioned embodiment. At timings of A and B indicated in FIG. 12, an $NH_3$ gas or an $O_3$ gas is exhausted from the interior of the process chamber 201 under the processing procedures and the processing conditions similar to those of Steps 3p and 4p of the film forming sequences illustrated in FIGS. 4 to 7.

In the film forming sequence example 1, at least one of the gas exhaust effect and the gas exhaust efficiency at the step of exhausting the $NH_3$ gas, which is performed at the timing of A, may be made larger than at least one of the gas exhaust effect and the gas exhaust efficiency at the step of exhausting the $O_3$ gas, which is performed at the timing of B. Furthermore, in the film forming sequence examples 2 and 3, at least one of the gas exhaust effect and the gas exhaust efficiency at the step of exhausting the $O_3$ gas, which is performed at the timing of A, may be made larger than at least one of the gas exhaust effect and the gas exhaust efficiency at the step of exhausting the $NH_3$ gas, which is performed at the timing of B. The reasons and the specific methods for obtaining the desired exhaust effect and the like are the same as those described in the aforementioned embodiment.

That is to say, the present disclosure may be suitably applied to a case where a film containing a predetermined element such as a semiconductor element, a metal element or the like is formed.

Process recipes (e.g., programs describing processing procedures and processing conditions of a substrate processing process) used in forming these various kinds of films may be prepared individually (in a plural number) according to the contents of a substrate processing process (e.g., the kind, composition ratio, quality, film thickness, processing procedure and processing condition of the film to be formed). Hereinafter, the process recipes will be simply referred to as recipes. In addition, at the start of the substrate processing, an appropriate recipe may be properly selected from the recipes according to the substrate processing contents. Specifically, the recipes individually prepared according to the substrate processing contents may be stored (or installed) in advance in the memory device 121c of the substrate processing apparatus via a telecommunication line or a recording medium (e.g., the external memory device 123) storing the recipes. Moreover, at the start of the substrate processing, the CPU 121a of the substrate processing apparatus may properly select an appropriate recipe from the recipes stored in the memory device 121c according to the substrate processing contents. This configuration enables a single substrate processing apparatus to form films of different kinds, composition ratios, qualities and thicknesses for general purposes and with enhanced reproducibility. In addition, this configuration makes it possible to reduce an operator's operation burden (e.g., a burden borne by an operator when inputting processing procedures and processing conditions) and to quickly start the substrate processing while avoiding an operation error.

The process recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

In the aforementioned embodiment, there has been described an example in which films are formed using a batch type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace. In these cases, the processing procedures and the processing conditions may be similar to, e.g., those of the aforementioned embodiment.

Figure 16A:
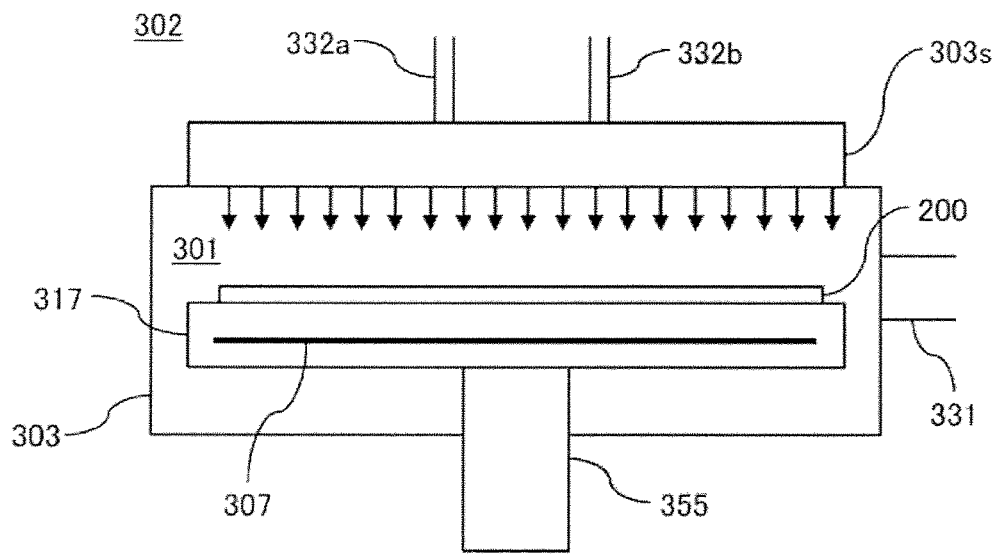
FIG. 16A is a schematic configuration view of a processing furnace of a substrate processing apparatus suitably used in another embodiment of the present disclosure, in which a portion of the processing furnace is shown in a vertical cross section.

The present disclosure may be suitably applied to, e.g., a case where a film is formed using a substrate processing apparatus provided with a processing furnace 302 illustrated in FIG. 16A. The processing furnace 302 includes a process vessel 303 which defines a process chamber 301, a shower head 303s as a gas supply part configured to supply a gas into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor gas and a gas supply port 332b configured to the supply the aforementioned reaction gas are connected to inlets (gas introduction holes) of the shower head 303s. A gas supply system similar to the precursor gas supply system of the aforementioned embodiment is connected to the gas supply port 332a. A gas supply system similar to the reaction gas supply system of the aforementioned embodiment is connected to the gas supply port 332b. A gas distribution plate configured to supply a gas into the process chamber 301 in a shower-like manner is installed in outlets (gas exhaust holes) of the shower head 303s. The shower head 303s is installed at such a position as to face the surfaces of the wafers 200 carried into the process chamber 301. An exhaust port 331 configured to evacuate the interior of the process chamber 301 is installed in the process vessel 303. An exhaust system similar to the exhaust system of the aforementioned embodiment is connected to the exhaust port 331.

Figure 16B:
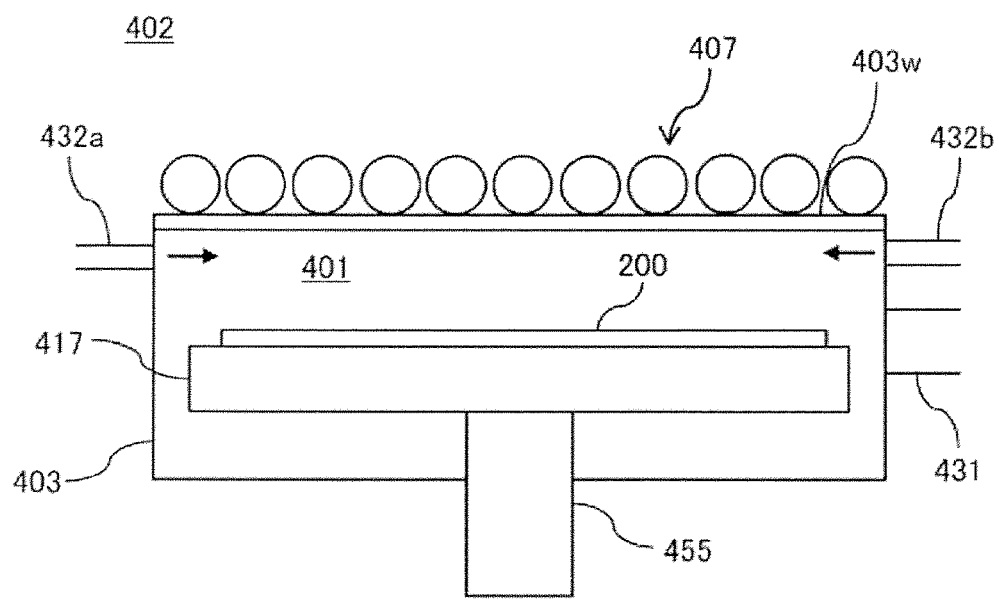
FIG. 16B is a schematic configuration view of a processing furnace of a substrate processing apparatus suitably used in a further embodiment of the present disclosure, in which a portion of the processing furnace is shown in a vertical cross section.

In addition, the present disclosure may be suitably applied to, e.g., a case where a film is formed using a substrate processing apparatus provided with a processing furnace 402 illustrated in FIG. 16B. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a configured to supply the aforementioned precursor gas and a gas supply port 432b as a gas supply part configured to supply the aforementioned reaction gas are connected to the process vessel 403. A gas supply system similar to the precursor gas supply system of the aforementioned embodiment is connected to the gas supply port 432a. A gas supply system similar to the reaction gas supply system of the aforementioned embodiment is connected to the gas supply port 432b. The gas supply ports 432a and 432b are respectively installed at the lateral side of the end portions of the wafers 200 carried into the process chamber 401, namely at such positions as not to face the surfaces of the wafers 200 carried into the process chamber 401. An exhaust port 431 configured to evacuate the interior of the process chamber 401 is installed in the process vessel 403. An exhaust system similar to the exhaust system of the aforementioned embodiment is connected to the exhaust port 431.

In the case of using these substrate processing apparatuses, film formation may be performed by the sequences and processing conditions similar to those of the embodiments and modifications described above. Effects similar to those of the embodiments and modifications described above may be achieved.

The embodiments and modifications described above may be appropriately combined with one another. In addition, the processing conditions used at this time may be similar to, e.g., the processing conditions of the embodiments described above.

Example

Descriptions will now be made on experimental results that support the effects achieved in the embodiments and the modifications described above.

As Sample 1, SiOCN films were formed on a plurality of wafers by the film forming sequence illustrated in FIG. 6, using the substrate processing apparatus according to the aforementioned embodiment. A HCDS gas was used as the precursor gas. A $C_3H_6$ gas was used as the C-containing gas. An $O_2$ gas was used as the O-containing gas. An $NH_3$ gas was used as the H-containing gas. At the step of exhausting the $O_2$ gas and at the step of exhausting the $NH_3$ gas, the performance time of the exhaust process (VAC) and the performance time of the purge process (PRG) were set at 30 seconds. Other processing conditions were set to fall within a range of the processing conditions described in the aforementioned embodiment.

As Sample 2, SiOCN films were formed on a plurality of wafers by the film forming sequence illustrated in FIG. 6, using the substrate processing apparatus according to the aforementioned embodiment. At the step of exhausting the $O_2$ gas and at the step of exhausting the $NH_3$ gas, the performance time of the exhaust process (VAC) and the performance time of the purge process (PRG) were set at 15 seconds. Other processing conditions were set similar to the processing conditions used when preparing Sample 1.

As Sample 3, SiOCN films were formed on a plurality of wafers by the film forming sequence illustrated in FIG. 7, using the substrate processing apparatus according to the aforementioned embodiment. At the step of exhausting the $O_2$ gas and at the step of exhausting the $NH_3$ gas, the performance time of the exhaust process (VAC) and the performance time of the purge process (PRG) were set at 15 seconds. The number of performance times $m_3$ of the cycle purge process performed at the step of exhausting the $O_2$ gas and the number of performance times $m_4$ of the cycle purge process performed at the step of exhausting the $NH_3$ gas were twice, respectively. Other processing conditions were set similar to the processing conditions used when preparing Sample 1.

As Sample 4, SiOCN films were formed on a plurality of wafers by performing, a predetermined number of times, a cycle that sequentially and non-simultaneously performs: a step of supplying an HCDS gas to the wafers accommodated within the process chamber; a step of exhausting the HCDS gas from the interior of the process chamber; a step of supplying a $C_3H_6$ gas to the wafers accommodated within the process chamber; a step of exhausting the $C_3H_6$ gas from the interior of the process chamber; a step of supplying an $O_2$ gas to the wafers accommodated within the process chamber; a step of exhausting the $O_2$ gas from the interior of the process chamber; a step of supplying an $NH_3$ gas to the wafers accommodated within the process chamber; and a step of exhausting the $NH_3$ gas from the interior of the process chamber. The processing conditions and the processing procedures are common at the respective steps of exhausting the HCDS gas, the $C_3H_6$ gas, the $O_2$ gas and the $NH_3$ gas. Specifically, only the purge process (PRG) was performed at the respective steps. The performance time of the purge process (PRG) was 6 seconds. Other processing conditions were set similar to the processing conditions used when preparing Sample 1.

The number of particles generated in the wafers of Samples 1 to 4 was measured in the upper portion, the central portion and the lower portion within the wafer arrangement region. Average values thereof were calculated. As a result, in the wafers of Samples 1 to 4, the average values were 11, 21, 15 and 94, respectively. Comparing the average values of Samples 1 to 3 with the average value of Sample 4, it can be noted that, in Samples 1 to 3 in which the gas exhaust effect and the like at the step of exhausting the $O_2$ gas and at the step of exhausting the $NH_3$ gas are made larger than the gas exhaust effect and the like at the step of exhausting the HCDS gas and at the step of exhausting the $C_3H_6$ gas, the number of particles can be made smaller than that of Sample 4. Comparing the average values of Samples 1 and 2 with each other, it can be noted that, in Sample 1 in which the performance time of the exhaust process (VAC) and the performance time of the purge process (PRG) are set long at the step of exhausting the $O_2$ gas and at the step of exhausting the $NH_3$ gas, the number of particles can be made smaller than that of Sample 2. Comparing the average values of Samples 2 and 3 with each other, it can be noted that, in Sample 3 in which the number of performance times $m_3$ of the cycle purge process performed at the step of exhausting the $O_2$ gas and the number of performance times $m_4$ of the cycle purge process performed at the step of exhausting the $NH_3$ gas are increased, the number of particles can be made smaller than that of Sample 2.

Aspects of the Present Disclosure

Hereinafter, some aspects of the present disclosure will be additionally described as supplementary notes.
(Supplementary Note 1)
According to one aspect of the present disclosure, there is provided a method of manufacturing a semiconductor device or a substrate processing method, including forming a film on a substrate by performing a cycle a predetermined number of times, the cycle including non-simultaneously performing:
supplying a precursor gas to the substrate in the process chamber;
exhausting the precursor gas from the process chamber;
supplying an oxygen-containing gas to the substrate in the process chamber;
exhausting the oxygen-containing gas from the process chamber;
supplying a hydrogen-containing gas to the substrate in the process chamber; and
exhausting the hydrogen-containing gas from the process chamber,
wherein at least one among an amount of an exhausted gas (a gas exhaust effect) and an exhaust rate (a gas exhaust efficiency) in the act of exhausting the oxygen-containing gas is set greater than an amount of an exhausted gas or an exhaust rate in the act of exhausting the precursor gas, and
at least one among an amount of an exhausted gas and an exhaust rate in the act of exhausting the hydrogen-containing gas is set greater than the amount of the exhausted gas or the exhaust rate in the act of exhausting the precursor gas.
(Supplementary Note 2)
In the method of Supplementary Note 1, a gas exhaust time in each of the act of exhausting the oxygen-containing gas and the act of exhausting the hydrogen-containing gas may be set longer than a gas exhaust time in the act of exhausting the precursor gas. Alternatively or additionally, a supply flow rate of a purge gas supplied into the process chamber in the act of exhausting the oxygen-containing gas and in the act of exhausting the hydrogen-containing gas may be set greater than a supply flow rate of a purge gas supplied into the process chamber in the act of exhausting the precursor gas. For example, the act of exhausting the precursor gas includes supplying a first purge gas into the process chamber, the act of exhausting the oxygen-containing gas includes supplying a second purge gas into the process chamber, the act of exhausting the hydrogen-containing gas includes supplying a third purge gas into the process chamber, and each of a supply flow rate of the second purge gas and a supply flow rate of the third purge gas is set greater than a supply flow rate of the first purge gas.
(Supplementary Note 3)
In the method of Supplementary Note 1 or 2, each of the act of exhausting the oxygen-containing gas and the act of exhausting the hydrogen-containing gas may include non-simultaneously performing a set a preset number of times, the set including:
exhausting an interior of the process chamber substantially without supplying a gas into the process chamber; and
supplying a purge gas into the process chamber, and
the act of exhausting the precursor gas includes supplying a purge gas into the process chamber. In some embodiments, exhausting the interior of the process chamber substantially without supplying a gas into the process chamber may not be performed in the act of exhausting the precursor gas. The exhaust may include depressurization-exhaust. As used herein, the phrase "substantially without supplying a gas into the process chamber" may include a case in which a gas such as an inert gas or the like is flowed into the process chamber at a low flow rate (e.g., 100 to 200 sccm) in addition to a case in which no gas is flowed into the process chamber.
(Supplementary Note 4)
In the method of any one of Supplementary Notes 1 to 3, in the act of forming the film, the act of supplying the oxygen-containing gas, the act of exhausting the oxygen-containing gas, the act of supplying the hydrogen-containing gas and the act of exhausting the hydrogen-containing gas may be successively performed in the named order, and
at least one among the amount of the exhausted gas and the exhaust rate in the act of exhausting the oxygen-containing gas may be set greater than the amount of an exhausted gas or the exhaust rate in the act of exhausting the hydrogen-containing gas.
(Supplementary Note 5)
In the method of Supplementary Note 4, a gas exhaust time in the act of exhausting the oxygen-containing gas may be set longer than a gas exhaust time in the act of exhausting the hydrogen-containing gas. Alternatively or additionally, a supply flow rate of a purge gas supplied into the process chamber in the act of exhausting the oxygen-containing gas may be set greater than a supply flow rate of a purge gas supplied into the process chamber in the act of exhausting the hydrogen-containing gas. For example, the act of exhausting the oxygen-containing gas includes supplying a first purge gas into the process chamber, the act of exhausting the hydrogen-containing gas includes supplying a second purge gas into the process chamber, and a supply flow rate of the first purge gas is set greater than a supply flow rate of the second purge gas.
(Supplementary Note 6)

In the method of Supplementary Note 4 or 5, the act of exhausting the oxygen-containing gas may include non-simultaneously performing a first set a first preset number of times, the first set including: exhausting an interior of the process chamber substantially without supplying a gas into the process chamber; and supplying a first purge gas into the process chamber (exhausting the interior of the process chamber while supplying the purge gas into the process chamber). The act of exhausting the hydrogen-containing gas may include non-simultaneously performing a second set a second preset number of times, the second set including: exhausting the interior of the process chamber substantially without supplying a gas into the process chamber; and supplying a second purge gas into the process chamber. The first preset number may be set greater than the second preset number.
(Supplementary Note 7)

In the method of any one of Supplementary Notes 1 to 3, in the act of forming the film, the act of supplying the hydrogen-containing gas, the act of exhausting the hydrogen-containing gas, the act of supplying the oxygen-containing gas and the act of exhausting the oxygen-containing gas may be successively performed in the named order, and at least one among the amount of the exhausted gas and the exhaust rate in the act of exhausting the hydrogen-containing gas may be set greater than the amount of the exhausted gas or the exhaust rate in the act of exhausting the oxygen-containing gas.
(Supplementary Note 8)

In the method of Supplementary Note 7, a gas exhaust time in the act of exhausting the hydrogen-containing gas may be set longer than a gas exhaust time in the act of exhausting the oxygen-containing gas. Alternatively or additionally, a supply flow rate of a purge gas supplied into the process chamber in the act of exhausting the hydrogen-containing gas may be set greater than a supply flow rate of a purge gas supplied into the process chamber in the act of exhausting the oxygen-containing gas. For example, the act of exhausting the oxygen-containing gas includes supplying a first purge gas into the process chamber, the act of exhausting the hydrogen-containing gas includes supplying a second purge gas into the process chamber, and a supply flow rate of the second purge gas is set greater than a supply flow rate of the first purge gas.
(Supplementary Note 9)

In the method of Supplementary Note 7 or 8, the act of exhausting the hydrogen-containing gas may include non-simultaneously performing a first set a first preset number of times, the first set including: exhausting the interior of the process chamber substantially without supplying a gas into the process chamber; and supplying a first purge gas into the process chamber (exhausting the interior of the process chamber while supplying the purge gas into the process chamber). The act of exhausting the oxygen-containing gas may include non-simultaneously performing a second set a second preset number of times, the second set including: exhausting the interior of the process chamber substantially without supplying a gas into the process chamber; and supplying a second purge gas into the process chamber. The first preset number may be set greater than the second preset number.
(Supplementary Note 10)

In the method of any one of Supplementary Notes 1 to 9, the oxygen-containing gas and the hydrogen-containing gas may be supplied to the substrate through a nozzle installed in the process chamber.
(Supplementary Note 11)

In the method of any one of Supplementary Notes 1 to 10, the precursor gas may be supplied through a first nozzle installed in the process chamber, the oxygen-containing gas may be supplied through a second nozzle installed in the process chamber, the second nozzle being different from the first nozzle, and the hydrogen-containing gas may be supplied through the second nozzle.
(Supplementary Note 12)

In the method of any one of Supplementary Notes 1 to 11, the hydrogen-containing gas may contain nitrogen and hydrogen.
(Supplementary Note 13)

In the method of any one of Supplementary Notes 1 to 12, the cycle may further include non-simultaneously performing: supplying a carbon-containing gas to the substrate in the process chamber; and exhausting the carbon-containing gas from the process chamber. At least one among the amount of the exhausted gas and the exhaust rate in the act of exhausting the oxygen-containing gas is set greater than the amount of the exhausted gas or the exhaust rate in the act of exhausting the precursor gas, at least one among the amount of the exhausted gas and the exhaust rate in the act of exhausting the oxygen-containing gas is set greater than an amount of an exhausted gas or an exhaust rate in the act of exhausting the carbon-containing gas, at least one among the amount of the exhausted gas and the exhaust rate in the act of exhausting the hydrogen-containing gas is set greater than the amount of the exhausted gas or the exhaust rate in the act of exhausting the precursor gas, and at least one among the amount of the exhausted gas and the exhaust rate in the act of exhausting the hydrogen-containing gas is set greater than the amount of the exhausted gas or the exhaust rate in the act of exhausting the carbon-containing gas.
(Supplementary Note 14)

In the method of Supplementary Note 13, a gas exhaust time in each of the act of exhausting the oxygen-containing gas and the act of exhausting the hydrogen-containing gas (the gas which contains nitrogen and hydrogen) may be set longer than a gas exhaust time in each of the act of exhausting the precursor gas and the act of exhausting the carbon-containing gas, Alternatively or additionally, a supply flow rate of a purge gas supplied into the process chamber in the act of exhausting the oxygen-containing gas and in the act of exhausting the hydrogen-containing gas (the gas which contains nitrogen and hydrogen) may be set greater than a supply flow rate of a purge gas supplied into the process chamber in the act of exhausting the precursor gas and in the act of exhausting the carbon-containing gas. For example, the act of exhausting the precursor gas includes supplying a first purge gas into the process chamber, the act of exhausting the oxygen-containing gas includes supplying a second purge gas into the process chamber, the act of exhausting the hydrogen-containing gas includes supplying a third purge gas into the process chamber, the act of exhausting the carbon-containing gas includes supplying a fourth purge gas into the process chamber, and each of a supply flow rate of the second purge gas and a supply flow rate of the third purge gas is set greater than each of a supply flow rate of the first purge gas and a supply flow rate of the fourth purge gas.

(Supplementary Note 15)

In the method of Supplementary Note 13 or 14, each of the act of exhausting the oxygen-containing gas and the act of exhausting the hydrogen-containing gas (the gas which contains nitrogen and hydrogen) may include non-simultaneously performing a set a preset number of times, the set including: exhausting an interior of the process chamber substantially without supplying a gas into the process chamber; and supplying a purge gas into the process chamber (exhausting the interior of the process chamber while supplying the purge gas into the process chamber), and each of the act of exhausting the precursor gas and the act of exhausting the carbon-containing gas includes supplying a purge gas into the process chamber. In some embodiments, exhausting the interior of the process chamber substantially without supplying a gas into the process chamber may not be performed in each of the act of exhausting the precursor gas and the act of exhausting the carbon-containing gas. The exhaust may include depressurization-exhaust.

(Supplementary Note 16)

In the method of any one of Supplementary Notes 3, 6, 9 and 15, in each of the act of exhausting the oxygen-containing gas and the act of exhausting the hydrogen-containing gas, a supply time of the purge gas in the act of supplying the purge gas into the process chamber (exhausting the interior of the process chamber while supplying the purge gas into the process chamber) is set shorter than an exhaust time of the process chamber in the act of exhausting the interior of the process chamber substantially without supplying a gas into the process chamber.

(Supplementary Note 17)

According to another aspect of the present disclosure, there is provided a method of manufacturing a semiconductor device or a substrate processing method, including forming a film on a substrate accommodated in a process chamber by performing a cycle a predetermined number of times, the cycle including non-simultaneously performing:

supplying a precursor gas to the substrate in the process chamber;

exhausting the precursor gas from the process chamber;

supplying an oxygen-containing gas to the substrate in the process chamber;

exhausting the oxygen-containing gas from the process chamber;

supplying a nitrogen- and hydrogen-containing gas to the substrate in the process chamber;

exhausting the nitrogen- and hydrogen-containing gas from the process chamber, wherein at least one among an amount of an exhausted gas and an exhaust rate in the act of exhausting the oxygen-containing gas is set greater than an amount of an exhausted gas or an exhaust rate in the act of exhausting the precursor gas, and at least one among an amount of an exhausted gas and an exhaust rate in the act of exhausting the nitrogen- and hydrogen-containing gas is set greater than the amount of the exhausted gas or the exhaust rate in the act of exhausting the precursor gas.

(Supplementary Note 18)

According to a further aspect of the present disclosure, there is provided a method of manufacturing a semiconductor device or a substrate processing method, including forming a film on a substrate accommodated in a process chamber by performing a cycle a predetermined number of times, the cycle including non-simultaneously performing:

supplying a precursor gas to the substrate in the process chamber;

exhausting the precursor gas from the process chamber;

supplying a carbon-containing gas to the substrate in the process chamber;

exhausting the carbon-containing gas from the process chamber;

supplying an oxygen-containing gas to the substrate in the process chamber;

exhausting the oxygen-containing gas from the process chamber;

supplying a nitrogen- and hydrogen-containing gas to the substrate in the process chamber;

exhausting the nitrogen- and hydrogen-containing gas from the process chamber, wherein at least one among an amount of an exhausted gas and an exhaust rate in the act of exhausting the oxygen-containing gas is set greater than an amount of an exhausted gas or an exhaust rate in the act of exhausting the precursor gas, at least one among an amount of an exhausted gas and an exhaust rate in the act of exhausting the nitrogen- and hydrogen-containing gas is set greater than the amount of the exhausted gas or the exhaust rate in the act of exhausting the precursor gas, at least one among the amount of the exhausted gas or the exhaust rate in the act of exhausting the oxygen-containing gas is set greater than an amount of an exhausted gas or an exhaust rate in the act of exhausting the carbon-containing gas, and at least one among the amount of the exhausted gas or the exhaust rate in the act of exhausting the nitrogen- and hydrogen-containing gas is set greater than the amount of the exhausted gas or the exhaust rate in the act of exhausting the carbon-containing gas.

(Supplementary Note 19)

According to a still further aspect of the present disclosure, there is provided a substrate processing apparatus, including:

a process chamber configured to accommodate a substrate;

a precursor gas supply system configured to supply a precursor gas to the substrate in the process chamber;

an oxygen-containing gas supply system configured to supply an oxygen-containing gas to the substrate in the process chamber;

a hydrogen-containing gas supply system configured to supply a hydrogen-containing gas to the substrate in the process chamber;

an exhaust system configured to exhaust a gas from the process chamber; and a control part configured to control the precursor gas supply system, the oxygen-containing gas supply system, the hydrogen-containing gas supply system and the exhaust system so as to perform a process of forming a film on the substrate by performing a cycle a predetermined number of times, the cycle including non-simultaneously performing:

supplying the precursor gas to the substrate in the process chamber;

exhausting the precursor gas from the process chamber;

supplying the oxygen-containing gas to the substrate in the process chamber;

exhausting the oxygen-containing gas from the process chamber;

supplying the hydrogen-containing gas to the substrate in the process chamber; and exhausting the hydrogen-containing gas from the process chamber, wherein at least one among an amount of an exhausted gas and an exhaust rate in the act of exhausting the oxygen-containing gas is set greater than an amount of an exhausted gas or an exhaust rate in the act of exhausting the precursor gas, and at least one among an amount of an exhausted gas and an exhaust rate in the act of exhausting the hydrogen-containing gas is set greater than the amount of the exhausted gas or the exhaust rate in the act of exhausting the precursor gas.
(Supplementary Note 20)

According to a yet still further aspect of the present disclosure, there is provided a program or a non-transitory computer-readable recording medium storing the program, wherein the program is configured to cause a computer to perform a process of forming a film on a substrate by performing a cycle a predetermined number of times, the cycle including non-simultaneously performing:

supplying a precursor gas to the substrate in the process chamber;

exhausting the precursor gas from the process chamber;

supplying an oxygen-containing gas to the substrate in the process chamber;

exhausting the oxygen-containing gas from the process chamber;

supplying a hydrogen-containing gas to the substrate in the process chamber; and exhausting the hydrogen-containing gas from the process chamber, wherein at least one among an amount of an exhausted gas and an exhaust rate in the act of exhausting the oxygen-containing gas is set greater than an amount of an exhausted gas or an exhaust rate in the act of exhausting the precursor gas, and at least one among an amount of an exhausted gas and an exhaust rate in the act of exhausting the hydrogen-containing gas is set greater than the amount of the exhausted gas or the exhaust rate in the act of exhausting the precursor gas.

According to the present disclosure in some embodiments, it is possible to suppress generation of particles when forming a film on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising forming a film on a substrate accommodated in a process chamber by performing a cycle a predetermined number of times, the cycle including non-simultaneously performing:
   (a-1) supplying a precursor gas to the substrate in the process chamber;
   (a-2) exhausting the precursor gas and a first purge gas from the process chamber;
   (b-1) supplying an oxygen-containing gas to the substrate in the process chamber;
   (b-2) exhausting the oxygen-containing gas and a second purge gas from the process chamber;
   (c-1) supplying a hydrogen-containing gas to the substrate in the process chamber; and
   (c-2) exhausting the hydrogen-containing gas and a third purge gas from the process chamber,
   wherein an exhausted gas amount in each of (b-2) and (c-2) is set greater than an exhaust gas amount in (a-2), an exhaust rate in each of (b-2) and (c-2) is set greater than an exhaust rate in (a-2), or the exhausted gas amount and the exhaust rate in each of (b-2) and (c-2) are respectively set greater than the exhausted gas amount and the exhaust rate in (a-2),
   wherein an amount of the second purge gas or an amount of the third purge gas is greater than an amount of the first purge gas,
   wherein the precursor gas is supplied through a first nozzle installed in the process chamber, the oxygen-containing gas is supplied through a second nozzle installed in the process chamber, the second nozzle being different from the first nozzle, and the hydrogen-containing gas is supplied through the second nozzle, and
   wherein the first purge gas is supplied through the first nozzle and the second purge gas and the third purge gas are supplied through the second nozzle during (a-2), (b-2) and (c-2), respectively.

2. The method of claim 1, wherein a gas exhaust time in each of (b-2) and (c-2) is set longer than a gas exhaust time in (a-2).

3. The method of claim 1, wherein
   (a-2) includes supplying the first purge gas into the process chamber,
   (b-2) includes supplying the second purge gas into the process chamber,
   (c-2) includes supplying the third purge gas into the process chamber, and
   each of a supply flow rate of the second purge gas and a supply flow rate of the third purge gas is set greater than a supply flow rate of the first purge gas.

4. The method of claim 1, wherein
   each of (b-2) and (c-2) includes non-simultaneously performing a set a preset number of times, the set comprising:
   exhausting an interior of the process chamber substantially without supplying a gas into the process chamber; and
   supplying the second or third purge gas into the process chamber, and
   (a-2) includes supplying the first purge gas into the process chamber.

5. The method of claim 1, wherein in the act of forming the film, (b-1), (b-2), (c-1), and (c-2) are successively performed in the named order, and
   the exhausted gas amount in (b-2) is set greater than the exhausted gas amount in (c-2), the exhaust rate in (b-2) is set greater than the exhaust rate in (c-2), or the exhausted gas amount and the exhaust rate in (b-2) are respectively set greater than the exhausted gas amount and the exhaust rate in (c-2).

6. The method of claim 5, wherein a gas exhaust time in (b-2) is set longer than a gas exhaust time in (c-2).

7. The method of claim 5, wherein
   (b-2) includes supplying the second purge gas into the process chamber,
   (c-2) includes supplying the third purge gas into the process chamber, and a supply flow rate of the second purge gas is set greater than a supply flow rate of the third purge gas.

8. The method of claim 5, wherein
(b-2) includes non-simultaneously performing a first set a first preset number of times, the first set comprising:
exhausting an interior of the process chamber substantially without supplying a gas into the process chamber; and
supplying a second purge gas into the process chamber,
(c-2) includes non-simultaneously performing a second set a second preset number of times, the second set comprising:
exhausting the interior of the process chamber substantially without supplying a gas into the process chamber; and
supplying the third purge gas into the process chamber, and
the first preset number is set greater than the second preset number.

9. The method of claim 1, wherein in the act of forming the film, (c-1), (c-2), (b-1), and (b-2) are successively performed in the named order, and
the exhausted gas amount in (c-2) is set greater than the exhausted gas amount in (b-2), the exhaust rate in (c-2) is set greater than the exhaust rate in (b-2), or the exhausted gas amount and the exhaust rate in (c-2) are respectively set greater than the exhausted gas amount and the exhaust rate in (b-2).

10. The method of claim 9, wherein a gas exhaust time in (c-2) is set longer than a gas exhaust time in (b-2).

11. The method of claim 9, wherein
(b-2) includes supplying the second purge gas into the process chamber,
(c-2) includes supplying the third purge gas into the process chamber, and
a supply flow rate of the third purge gas is set greater than a supply flow rate of the second purge gas.

12. The method of claim 9, wherein
(c-2) includes non-simultaneously performing a first set a first preset number of times, the first set comprising:
exhausting the interior of the process chamber substantially without supplying a gas into the process chamber; and
supplying a third purge gas into the process chamber,
(b-2) includes non-simultaneously performing a second set a second preset number of times, the second set comprising:
exhausting the interior of the process chamber substantially without supplying a gas into the process chamber; and
supplying the second purge gas into the process chamber, and the first preset number is set greater than the second preset number.

13. The method of claim 1, wherein the hydrogen-containing gas contains nitrogen and hydrogen.

14. The method of claim 1, wherein the cycle further includes non-simultaneously performing:
(d-1) supplying a carbon-containing gas to the substrate in the process chamber; and
(d-2) exhausting the carbon-containing gas from the process chamber,
the exhausted gas amount in each of (b-2) and (c-2) is set greater than an exhausted gas amount in (d-2), the exhaust rate in each of (b-2) and (c-2) is set greater than an exhaust rate in (d-2), or the exhausted gas amount and the exhaust rate in each of (b-2) and (c-2) are respectively set greater than the exhausted gas amount and the exhaust rate in (d-2).

15. The method of claim 14, wherein a gas exhaust time in each of (b-2) and (c-2) is set longer than a gas exhaust time in each of (a-2) and (d-2).

16. The method of claim 14, wherein
(a-2) includes supplying the first purge gas into the process chamber,
(b-2) includes supplying the second purge gas into the process chamber,
(c-2) includes supplying the third purge gas into the process chamber,
(d-2) includes supplying a fourth purge gas into the process chamber, and
each of a supply flow rate of the second purge gas and a supply flow rate of the third purge gas is set greater than each of a supply flow rate of the first purge gas and a supply flow rate of the fourth purge gas.

17. The method of claim 14, wherein each of (b-2) and (c-2) includes non-simultaneously performing a set a preset number of times, the set comprising:
exhausting an interior of the process chamber substantially without supplying a gas into the process chamber; and
supplying the second or third purge gas into the process chamber, and
(a-2) includes supplying the first purge gas into the process chamber, and (d-2) includes supplying a fourth purge gas into the process chamber.

18. The method of claim 4, wherein in each of (b-2) and (c-2), a supply time of the second or third purge gas in the act of supplying the second or third purge gas is set shorter than an exhaust time in the act of exhausting the interior of the process chamber.

* * * * *